US005456945A

United States Patent [19]
McMillan et al.

[11] Patent Number: 5,456,945
[45] Date of Patent: Oct. 10, 1995

[54] METHOD AND APPARATUS FOR MATERIAL DEPOSITION

[75] Inventors: Larry D. McMillan; Carlos A. Paz de Araujo; Tommy L. Roberts, all of Colorado Springs, Colo.

[73] Assignee: Symetrix Corporation, Colorado Springs, Colo.

[21] Appl. No.: 993,380

[22] Filed: Dec. 18, 1992

Related U.S. Application Data

[63] Continuation-in-part of Ser. No. 660,428, Feb. 25, 1991, abandoned, which is a continuation-in-part of Ser. No. 690,940, Pat. No. 5,138,520, filed as PCT/VS89/D5882 12/27/89 which is a continuation-in-part of Ser. No. 290,468, Dec. 27, 1988, abandoned.

[51] Int. Cl.$^6$ .................................................. H01L 21/00
[52] U.S. Cl. ....................... 427/252; 118/715; 118/724; 427/421
[58] Field of Search .................................. 427/252, 421; 118/715, 724, 725, 51

[56] References Cited

U.S. PATENT DOCUMENTS

| | | | |
|---|---|---|---|
| 3,473,959 | 10/1969 | Ehinger et al. | 117/201 |
| 3,661,637 | 5/1972 | Sirtl | 117/201 |
| 4,442,135 | 4/1984 | Snaddon | 427/31 |

(List continued on next page.)

FOREIGN PATENT DOCUMENTS

| | | |
|---|---|---|
| 233610 | of 1987 | European Pat. Off. . |
| 420596 | 4/1991 | European Pat. Off. . |
| 198718 | of 1960 | Japan . |
| 128264 | of 1960 | Japan . |
| 246826 | of 1962 | Japan . |
| 22420 | of 1962 | Japan . |
| 96327 | of 1962 | Japan . |
| 116768 | of 1963 | Japan . |
| 61-83921 | 8/1986 | Japan . |
| WO9215112 | 9/1992 | WIPO . |

OTHER PUBLICATIONS

"Aerosol Assisted Chemical Vapor Deposition of Superconducting $YBa_2Cu_3O_{7-x}$"; Salazar et al; Physica C (Netherlands), vol. 198; No. 3–4, Aug. 1, 1992; abstract only.

Vest, G. M., et al., "Synthesis of Metallo–Organic Compounds for MOD Powders & Films", Mat. Res. Soc. Symp. Proc., vol. 60, 1986, pp. 35–42.

Kwak, B. S., et al., "Metalorganic Chemical Vapor Deposition of $PbTiO_3$ Thin Films", Appl. Phys. Lett. 53(18), pp. 1702–1704.

Yamada, A., et al., "Photochemical Vapor Deposition of $Si/Si_{1-x}Ge_x$ Strained Layer Superlattices at 250° C," Jap. Journ. Appl. Phys, vol. 27, 11, 1988, pp. L2174–L2176.

Vest, R. W., et al., "$PbTiO_3$ Films From Metalloorganic Precursors", IEEE Transactions on Ultrasonics, Ferroelectrics, & Freq. Control, vol. 35, 6, 1988, pp. 711–717.

Melnick, B. M. et al., "Process Optimization & Characterization of Device Worthy Sol–Gel Based PZT for Ferroelectric Memories", Ferroelectrics, vol. 109, 1990, pp. 1–23.

Sanchez, L. E., et al., "Processing & Characterization of Sol–Gel Derived Very Thin Film Ferroelectric Capacitors", Ferroelectrics, vol. 116, 1–2, 1991, pp. 1–17.

McMillan, L. D., et al., "Liquid Source CVD", ISIF Conference Paper, 1991.

Primary Examiner—R. Bruce Breneman
Assistant Examiner—George Goudreau
Attorney, Agent, or Firm—Duft, Graziano & Forest

[57] ABSTRACT

A method and apparatus are disclosed for forming thin films of chemical compounds utilized in integrated circuits. The method includes steps of forming a precursor liquid comprising a chemical compound in a solvent, providing a substrate within a vacuum deposition chamber, producing a mist of the precursor liquid, and flowing the mist into the deposition chamber while maintaining the chamber at ambient temperature to deposit a layer of the precursor liquid on the substrate. The liquid is dried to form a thin film of a solid material on the substrate, then the integrated circuit is completed to include at least a portion of the film of solid material in a component of the integrated circuit.

29 Claims, 10 Drawing Sheets

U.S. PATENT DOCUMENTS

| | | | |
|---|---|---|---|
| 4,489,102 | 12/1984 | Olmer et al. | 427/54.1 |
| 4,569,855 | 2/1986 | Matsuda et al. | 427/35 |
| 4,571,350 | 2/1986 | Parker et al. | 427/109 |
| 4,585,671 | 4/1986 | Kitagawa et al. | 427/54.1 |
| 4,683,147 | 7/1987 | Eguchi et al. | 427/54.1 |
| 4,689,247 | 8/1987 | Doty et al. | 427/126.1 |
| 4,792,463 | 12/1988 | Okada et al. | 427/126.3 |
| 4,811,684 | 3/1989 | Tashiro et al. | 118/50.1 |
| 4,832,986 | 3/1989 | Gladfelter et al. | 427/248.1 |
| 4,888,305 | 12/1989 | Yamasaki et al. | 437/101 |
| 5,028,455 | 7/1991 | Miller et al. | 427/126.3 |
| 5,069,157 | 12/1991 | Imai | 118/314 |
| 5,119,760 | 6/1992 | McMillan et al. | 118/722 |
| 5,138,520 | 8/1992 | McMillan et al. | 361/311 |

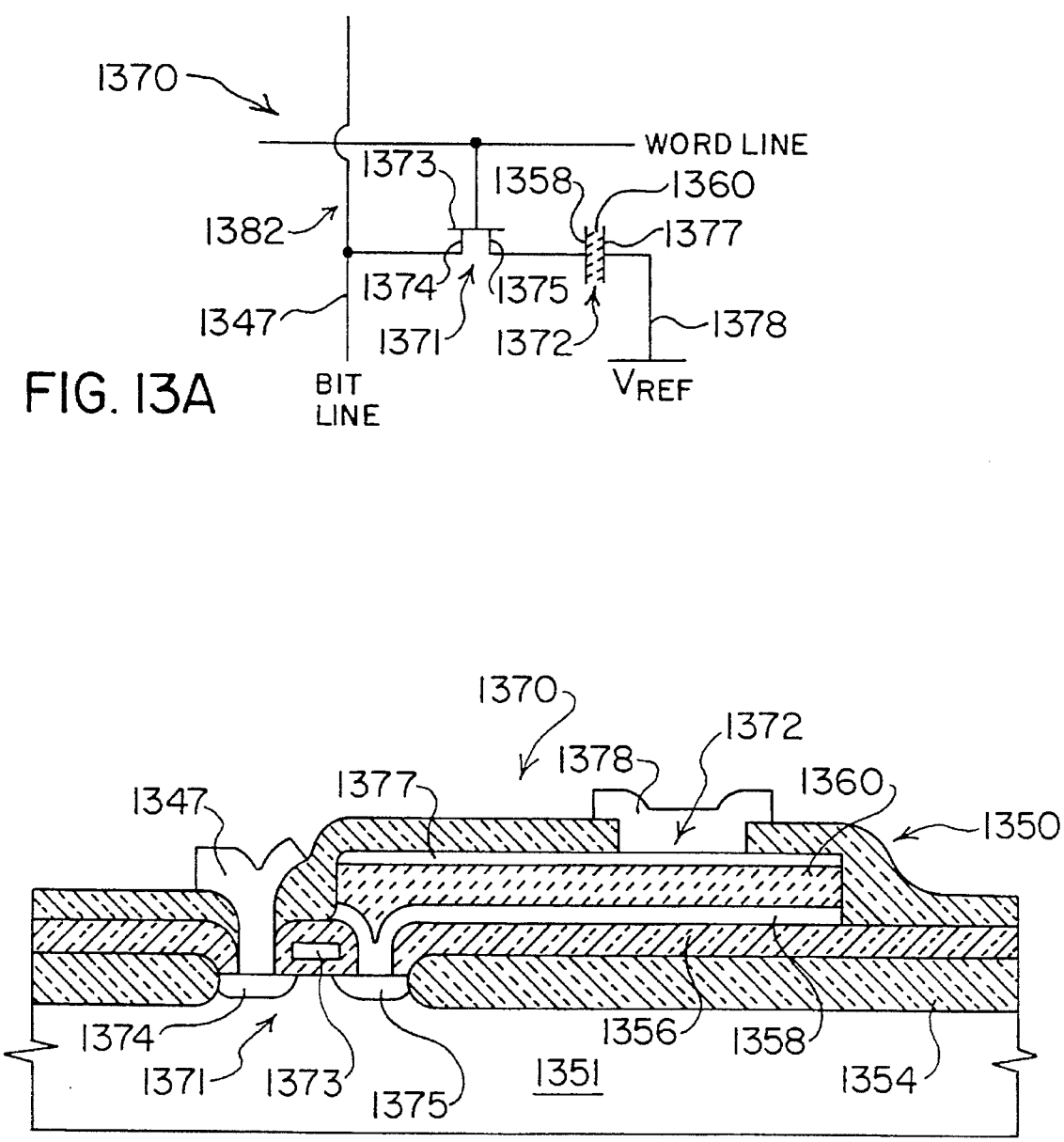

METHOD AND APPARATUS FOR MATERIAL DEPOSITION

This application is a continuation-in-part of U.S. patent application Ser. No. 07/660,428 filed Feb. 25, 1991, now abandoned, which is a continuation-in-part of U.S. patent application Ser. No. 07/690,940 filed Jun. 17, 1991, now U.S. Pat. No. 5,138,520, based on PCT application US89/05882 filed Dec. 27, 1989, which is in turn a continuation-in-part of U.S. patent application Ser. No. 07/290,468 filed Dec. 27, 1988, now abandoned.

FIELD OF THE INVENTION

The invention relates to methods for depositing high quality films of complex (compound) materials on substrates, and apparatus for effecting such methods. Particularly, the invention relates to fabrication of integrated circuits by flowing a mist onto a wafer, and then drying the mist to form an integrated circuit component.

PROBLEM

There are known methods for depositing thin films of complex compounds such as metal oxides, ferroelectrics, super-conductors, materials with high dielectric constants, gems, etc. Such known methods include: vacuum evaporation (i.e., E-beam, laser ablation, etc.); vacuum sputtering (i.e., E-beam, D.C., R.F., ion-beam, etc.); powder metallurgy; reactive chemical vapor deposition, including metalorganic chemical vapor deposition (MOCVD); and liquid application methods (i.e., spin-on techniques, dipping and spraying). All of such known methods, however, have significant disadvantages associated therewith.

For example, vacuum evaporation methods do not work well with materials having high melting (vaporization) temperatures, especially where exacting concentrations of multiple element compounds are required.

With vacuum sputtering methods, that involve the construction of targets of the desired material and bombardment of the target with atomic particles/ions such that particles of the material are sputtered from the target and driven to the substrate, most commercially available target sources have significant quantities of impurities therein so that even before the sputtering process begins there is a significant chance of failure due to impurities in the targets. Further, it is difficult to control chemical proportions/stoichiometry of materials deposited in a sputtering process because sputtering targets will age with usage such that the stoichiometry of the resulting deposited films will vary with continuing target usage. Also, if a different film stoichiometry or a different compound is desired, a new target must be constructed and installed in the apparatus at considerable expense and inconvenience, noting that construction of new targets usually requires the expenditure of days or weeks of time.

Powder metallurgy methods of producing films involves grinding and mixing of powders, forming a slurry with water or some other carrier, applying the slurry to substrates by spraying, painting or the like, and then firing the applied films at high temperatures such that the carrier is driven off and the particles are melted together to form the desired film. With such methods it is difficult to maintain proper stoichiometry and cleanliness and still achieve thin films with accurately controlled thicknesses. Also, this method cannot always be used to produce stoichiometric films that are less than a few microns in thickness, such as is required/desirable in many applications.

With regard to known reactive deposition processes, for forming thin films of chemical compounds, such as MOCVD, significant disadvantages are associated with the handling of the raw materials that are injected into a process reactor inasmuch as these materials are usually very toxic and there are many strict governmental standards for handling of these materials, which makes such handling both difficult and expensive. Further, the reactive nature of known chemical vapor deposition processes (in which reactive gases are flowed into a reactor and are decomposed and/or reacted together to form a desired compound which then deposits on a substrate) is generally hard on the reactor itself, so that the reactor must be constructed to withstand the reactions and must often be maintained at considerable cost. Also, it is difficult to consistently deposit stoichiometrically correct, multiple-component thin films according to known chemical vapor deposition processes, due to the difficulty of precisely controlling chemical reactions within the deposition reactor.

Additionally, known chemical vapor deposition processes and subsequent annealing processes, which are required with many thin films such as ferroelectrics, are normally performed at relatively high reactor temperatures, which tends to damage the thin films and the substrates onto which they are deposited. Damage to the thin films includes removal of certain critical elements therefrom, such as lead; formation of pores, secondary phases and large grains as a result of nonstoichiometry.

Liquid application techniques, which involve applying the liquid on substrates (usually silicon or GaAs wafers), then drying and firing the films on a hot plate or in a furnace, have attendant problems in both the application step and the drying step. With regard to the liquid application step, it is difficult to keep impurities (such as dust particles, moisture, etc.) out of the films because most of the application techniques are conducted under ambient conditions.

In addition, prior art film application techniques provide poor "step coverage" of a substrate to be covered; i.e., the prior art techniques result in a relatively excessive build-up of deposition of the film at the boundary of any discontinuities on the substrate.

Further, it is often difficult to control the thickness of films applied by the known liquid application techniques, while the ability to deposit extremely thin films using such techniques is limited. Present gas source chemical vapor deposition techniques are generally not uniformly conformal when a "step" on a substrate is to be covered by a liquid film. Such techniques typically deposit a "cusp" or "cornice" of material at the top of the step, and do not smoothly conform to the hard angle at the step bottom.

Additionally, the drying step of such processes requires a high-temperature environment which is relatively violent due to the evaporation of solvents from the applied film, which may leave damaging pores (or pop holes) in the thin film. This drying step, being at high temperatures, also enters the range of sintering temperatures which can cause unwanted phases of the deposited compound to form randomly across the film.

SOLUTION

The present invention has been developed to overcome the many problems and disadvantages associated with known deposition techniques for depositing thin films of complex chemical compounds including those discussed above, and to generally fulfill a great need in the art by providing a production worthy process which can be used for easily and economically producing thin films (from a few angstroms to microns in thickness) of various complex materials such as ferroelectrics, superconductors, and metal oxides.

According to the present invention, there is provided a method of fabricating an integrated circuit comprising the steps of: forming at least one precursor liquid of including an element and a solvent, providing a substrate within an enclosed deposition chamber, producing a mist of the precursor liquid, and introducing the mist into the deposition chamber at ambient temperature so that the mist is flowed evenly over the substrate to form a film of the precursor liquid on the substrate.

In one embodiment, deposition occurs while applying ultraviolet radiation to the mist and the substrate.

In another embodiment, deposition occurs while applying a DC bias between two parallel plates with the substrate located between them.

During the deposition process the deposition chamber is pumped to a slight vacuum to remove the solvent from the film of precursor liquid; after deposition the vacuum is preferably increased to dry the precursor, thus leaving a layer of solid material comprising the element on the substrate. The layered substrate is then preferably heated and annealed to produce a thin film of the final desired material including the element. The integrated circuit is then completed to include at least a portion of the final desired material in a circuit component.

The mist being flowed into the deposition chamber is contained within a small, semi-enclosed space within the deposition area by an adjustable barrier plate located above the substrate. The direction of mist flow is parallel to the substrate, which allows molecular collisions at ambient temperature to effect the coating of a substrate, as opposed to the relatively violent alternatives of using the momentum of the particles or heating the liquid material to force or accelerate the deposition process. Heating of the material to be deposited, either prior to or during deposition, results in a film which is more likely to crack or form pin holes during the drying stage.

Additionally, if a plurality of precursor liquids are utilized, mists of the precursor liquids are separately generated and then mixed prior to being flowed into the deposition chamber.

Also, since the mist is "flowed on," the deposition of the applied material is extremely conformal over the top of any "steps" on a given substrate, and tends to smoothly conform to the hard angle at the bottom of the step.

According to the present invention there is also provided apparatus for effecting the above methods.

It is an object of the present invention to provide highly versatile methods and apparatus having the capability to easily and inexpensively produce a large variety of thin films of various complex materials such as ferroelectrics, superconductors, metal oxides, materials having high dielectric constants, etc.

It is a further object of the present invention to provide such methods and apparatus having the capability of producing such thin films in a wide range of thicknesses, i.e., from a few angstroms to microns in thickness.

It is yet another object of the present invention to provide such apparatus which can deposit high quality thin films of different materials in successive layers.

It is a still further object of the present invention to produce thin films at ambient temperature and at slightly below atmospheric pressure.

Other objects, advantages and salient features of the present invention will become apparent from the following detailed description which, when taken into conjunction with the annexed drawings, discloses a number of embodiments of the present invention.

BRIEF DESCRIPTION OF THE DRAWING

FIG. 4b is an exploded view of the mist generating apparatus of FIG. 4a;

FIGS. 5a and 5b show modifications of the apparatus of FIG. 4a;

FIG. 13a shows an electrical schematic of a ferroelectric DRAM memory cell; and

FIG. 13b shows a cross-sectional view of a portion of an integrated circuit implementing the circuit of FIG. 13A as may be fabricated utilizing the apparatus and method of the invention.

DETAILED DESCRIPTION

Overview

Figure 1:
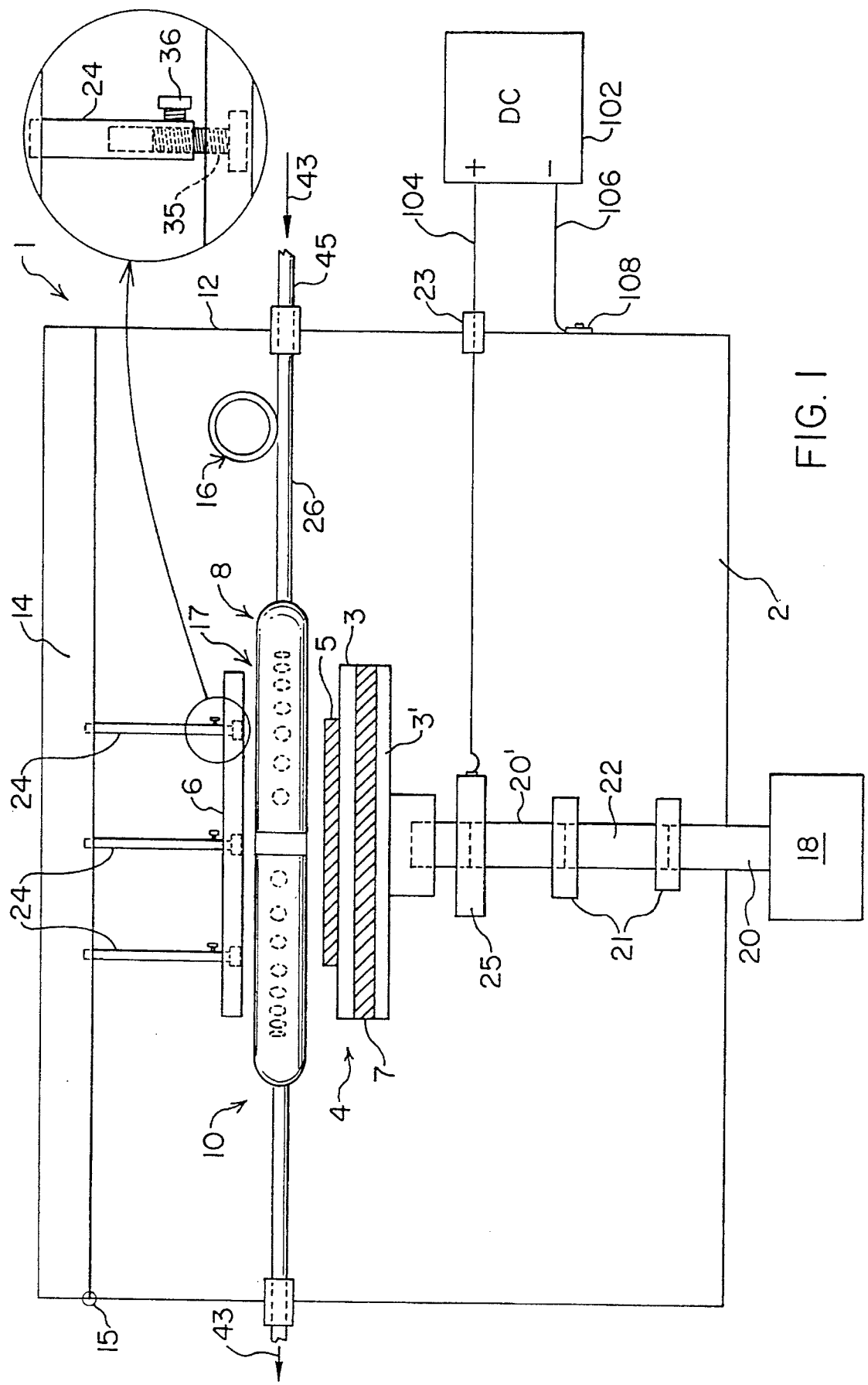
FIG. 1 is a cutaway side view of the deposition chamber of the apparatus according to one embodiment of the invention.

According to a primary aspect of the present invention, precursor liquids of desired chemical compounds are initially prepared, and then mists of the solutions are generated, flowed into a deposition chamber and deposited in thin films/layers on substrates disposed within the deposition chamber. In this disclosure, the term "substrate" is a general term including any one or number of layers of material on an underlying wafer, such as a silicon wafer, in addition to the silicon substrate itself. That is, it is any object on which a layer of material is deposited using the process and apparatus of the invention. Precursor liquids include sol-gel precursor formulations, which in general are comprised of metal-alkoxides in an alcohol solvent, and metallorganic precursor formulations, sometimes referred to as MOD formulations, which in general comprise a metalcarboxylate formed by reacting a carboxylic acid, such as n-decanoic acid or 2-ethylhexanoic acid, with a metal or metal compound in a solvent, as well as other precursor formulations. Metal 2-ethylhexanoates and octanoates appear to be the most useful of these compounds.

The term "mist" as used herein is defined as fine drops of a liquid carried by a gas. The term "mist" includes an aerosol, which is generally defined a colloidal suspension of solid or liquid particles in a gas. The term mist also includes a vapor, a fog, as well as other nebulized suspensions of the precursor solution in a gas. Since the above terms have arisen from popular usage, the definitions are not precise, overlap, and may be used differently by different authors. Herein, the term aerosol is intended to include all the suspensions included in the text *Aerosol Science and Technology*, by Parker C. Reist, McGraw-Hill, Inc., New York, 1983, which is hereby incorporated by reference. The term "mist" as used herein is intended to be broader than the term aerosol, and includes suspensions that may not be included under the term aerosol, vapor, or fog.

The precursor liquid solution is preferably obtained by preparing precursors for each element using alkoxide chemistry, carboxylic acid chemistry, or other wet chemistry techniques, which lead to a common solvent. The solution having that common solvent is preferably used as the sole source for the entire deposition process. However, the invention also contemplates using multiple precursor sources in parallel. In particular, other sources may be used in parallel for doping or modifying the final desired compound. In the preferred precursor liquid, the elements of the desired chemical compound to be fabricated are contained in one or more precursor chemical compounds in solution with the common solvent. Examples of lead zirconium titanate (PZT) and barium strontium titanate (BST) precursor formation are illustrated below.

Use of precursor liquids is highly desirable for many reasons. First, the solutions themselves are relatively easy to generate, even for complex compounds. In this regard, there is an extensive amount of published literature available detailing various sol-gel preparation techniques, MOD formulation techniques, etc. used in relation to the known liquid application methods of forming thin films, as discussed above. One such publication is Process Optimization and Characterization of Device Worthy Sol-gel Based PZT for Ferroelectric Memories (B. M. Melnick, et al., *FERROELECTRICS*, Vol. 109, Gordon and Breach, 1990 [Paper Ref. No. SIF-8]). The complete disclosure of this publication is incorporated herein by reference thereto. Other precursors are disclosed in U.S. patent application Ser. No. 981,133, which is also hereby incorporated by reference.

The precursor liquids used in the present invention are substantially less toxic and easier to handle than the corresponding reactants which are used in conventional, reactive deposition methods as discussed above, thereby allowing the precursor liquids to be handled and processed at substantially lower cost than the corresponding reactants.

The precursor liquids used in the present invention are also stabilized solutions. Here, "stabilized" means that key bonds of the desired final chemical compound are formed in the process of forming the precursor, and after such formation are stable. This has two aspects. First, the solutions do not react or deteriorate when stored over moderately long periods. Thus the stabilized solutions according to the invention have relatively long shelf lives, which makes the manufacturing process simpler and more efficient. The second aspect of the solutions being stabilized is that bonds formed when forming the precursor remain stable throughout the deposition process and form at least a portion of the bonds in the final desired chemical compound. For example, a metal—alkoxide may be given by the formula: R—O—M—O—R, where M is the metal, O is oxygen, and R is an alkyl group. When controlled energy is added to the metal alkoxide, the result is a molecule comprising a metal atom bound to an oxygen atom, i.e, a metal oxide, plus alkyl molecules or fragments of alkyl molecules as represented by the equation:

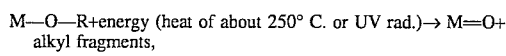

where "=" represents a double bond. In terms of a metal carboxylate, the equation may be written:

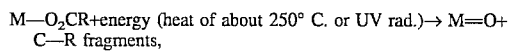

where R is again the alkyl group, M the metal, O is oxygen, and C is carbon. In the preferred embodiment, the precursor is deposited on the substrate and the disassociation of the metal-oxide molecules from the solvent and the alkyl or other fragments takes place on the substrate, although some of the disassociation may take place in the mist. The removal of the undesired fragments primarily takes place by being pumped out with a vacuum and/or being driven off by heating at a low heat of less than about 250° C. Generally after the bake (heating) step all disassociation is complete. The anneal process repairs oxygen deficiencies in the film and forces the desired crystal structure, however the basic metal-oxide bonds remain. Thus the metal-oxygen bond in the precursor remains stable and passes through the deposition process to form the metal-oxygen bond of the final desired metal-oxide compound.

The use of precursor liquids results in high quality of thin films because the precursor liquid can be accurately and consistently produced such that the desired chemical compound after deposition, is uniformly, stoichiometrically correct and because the deposition methods of the present invention do not involve violent chemical or physical reactions which either significantly destabilize the chemical compound of its predetermined molecular formulation or cause non-uniform deposition of the compound, cracking, etc.

According to the method of the present invention, the mist of a precursor liquid is evenly flowed across and onto a substrate at ambient temperature. As will be discussed further below, a key aspect of the flow process is that the mist is flowed across the substrate via multiple input ports and exits the area above the substrate via multiple exhaust ports, with the ports being distributed in close proximity to and about the periphery of the substrate to create a substantially evenly distributed flow of mist across the substrate.

Another feature of the deposition process is that it is a relatively low energy process as compared to prior art deposition processes. It is believed that the deposition is caused by relatively low energy kinetic interactions between the liquid particles and also relatively low energy kinetic interactions between the particles and the barrier plate opposite the substrate. It has been found that heating the deposition chamber or substrate during deposition leads to inferior quality thin films.

During, after, or both during and after deposition, the precursor liquid is treated to form a thin film of solid material on the substrate. In this context, "treated" means any one or a combination of the following: exposed to vacuum, ultraviolet radiation, electrical poling, drying, heating, and annealing. In the preferred embodiment UV radiation and electrical poling are optionally applied to the precursor solution during deposition. The ultraviolet radiation is preferably also applied after deposition. After deposition, the material deposited on the substrate, which is liquid in the preferred embodiment, is preferably exposed to vacuum for a period, then is heated, and then annealed. The chemistry of this process is not entirely understood. It is believed that the UV assists in disassociating the metal-oxide molecules, or other elements that comprise the desired final chemical compound, from the solvent and the organics or other fragments of the precursor compounds. It is believed the electrical poling increases the dwell time of the mist in the area of the substrate thus increasing the chance of collisions with other mist particles which cause the particles to rebound toward the substrate. It is believed that exposure to vacuum helps to evaporate the solvent and remove the organics or other fragments that have become disassociated from the elements of the final compound. It is believed that the heating removes whatever is left of the solvent, further disassociates the metal-oxide molecules or other elements of the desired compound from the organics or other fragments of the precursor compounds, and drives off the organics. It is believed that after the heating step, the material of the deposited thin film essentially comprises the elements of the final desired chemical compound, though they may not be in the final desired crystal structure. It is believed that the annealing may break up whatever bonds of the precursor chemical compounds that remain and drive off any remaining organics from the precursor compounds, but primarily repairs damaged areas and causes the desired elements to form the final desired crystal structure. However, intermediate chemical compounds, that is compounds that are not either the original precursor chemical compounds nor the final desired chemical compound, may form during the deposition process, the vacuum exposure, the heating, and/or the annealing. The preferred process of the invention is one in which the misted precursor solution is deposited directly on the substrate and the dissociations and removal of the solvent and organics or other fragments takes place primarily after the solution is on the substrate. However, in another aspect the invention also contemplates a process in which the final desired chemical compound or an intermediate compound is separated from the solvent and organics during the deposition and the final desired chemical compound or an intermediate compound is deposited on the substrate. In both aspects, preferably, one or more bonds of the precursor pass through to the final film.

An important parameter of many complex thin films, such as ferroelectric films, is that they are generally required to be quite thin (for example, within a range of 200 angstroms–5000 angstroms). Such film thicknesses can be readily achieved by the process and apparatus according to the invention. The invention can also be used to generate much thicker films, if desired.

Another aspect of the invention involves the technique of solvent exchange. Many times a compound X will dissolve in one particular solvent only and no other solvent. Similarly, a compound Y may dissolve in a different solvent and the solvent for compound X is not compatible with the solvent for compound Y. Solvent exchange is used to produce a precursor having compounds X and Y in a common solvent. That common solvent is preferably the solvent to which the system may be tuned. Generally, solvent exchange comprises adding the common solvent and distilling away the other solvents. To remove the undesired solvents from a solution, the solution is heated above the boiling point of the solvents to be removed and below the boiling point of the solvent or solvents that are desired to be retained. For example, if a xylene solvent is desired, xylene is added to a given solution, and the other solvents are distilled away until the desired volume and viscosity are reached.

Furthermore, the present invention tailors a common solvent for the correct vapor pressure for flowing the precursor through the valves and system tubing, etc., while reducing clogging of the system from precursor residue.

The invention is well-suited for the deposition of high quality thin films of compounds such as ferroelectrics, super-conductors, materials with high dielectric constants, and gems, etc. For example, the invention can be used to deposit thin films of ferroelectric materials having a general composition of $ABO_3$, including $PbTiO_3$, $Pb_xZr_yTiO_3$, $Pb_x La_yZr_zTiO_3$, and $YMnO_3$, where Y represents any rare-earth element. In addition, the invention can also be used to deposit thin films of barium strontium titanate $[(Ba,Sr)TiO_3]$, Strontium Titanate $(SrTiO_3)$, as well as other multi-element compounds, such as those described in U.S. patent application Ser. No. 965,190, filed on Oct. 23, 1992, titled "Layered Super lattice Materials for Ferroelectric, High Dielectric Constant, and Integrated Circuit Fabrication", which is hereby incorporated by reference.

Figure 8:
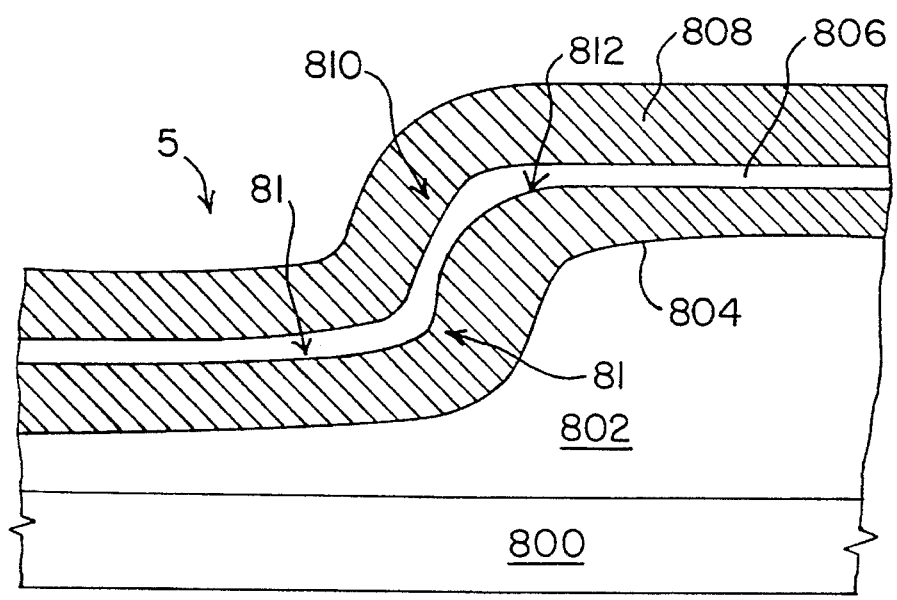
FIG. 8 is a drawing of an electron micrograph of a device fabricated with the process and apparatus of the invention showing the step coverage of a thin film of BST applied to a substrate.

FIG. 8 is a drawing of an electron micrograph of an actual device fabricated according to the process of the invention utilizing the apparatus of the invention. This drawing illustrates the step coverage of a thin film 806 of barium strontium titanate (BST) applied to a substrate 5. As shown from bottom to top of FIG. 8, there is a silicon wafer 800, a layer 802 of $SiO_2$, a layer 804 of platinum, a layer 806 of BST, and another layer 808 of platinum deposited on the wafer 800.

A step 810 was formed in layer 802 over which the layer 804 of platinum was deposited, followed by a layer 806 of BST, which was deposited using the method and apparatus of the present invention. Note that, because the BST precursor mist is "flowed on," the deposition of the applied material 806 is extremely conformal over the top 812 and bottom 814 of step 810. There is some filling in of the hard angle 814 near the bottom of the step 810, but this filling in is substantially less than for spin-on deposition and compares well to the conformation possible in state-of-the-art integrated circuit deposition techniques commonly used in the fabrication of integrated circuits.

Deposition Apparatus

As shown in FIG. 1, there is a thin film deposition apparatus according to one exemplary embodiment of the invention, the apparatus being generally designated at 1. Apparatus 1 comprises a deposition chamber 2 containing a substrate holder 4, a barrier plate 6, an input nozzle assembly 8, an exhaust nozzle assembly 10, and an ultraviolet radiation source 16. The deposition chamber 2 includes a main body 12, a lid 14 which is securable over the main body 12 to define an enclosed space within the deposition chamber 2. The chamber is connected to a plurality of external vacuum sources described below. Lid 14 is pivotally connected to the main body 12 using a hinge as indicated at 18. In operation, a mist and inert carrier gas are fed in through tube 45, in direction 43, and pass through input nozzle assembly 8, where the mist is deposited onto substrate 5. Excess mist and carrier gas are drawn out of deposition chamber 2 via exhaust nozzle 10.

Substrate holder 4 is made from two circular plates 3, 3' of electrically conductive material, such as stainless steel, the top plate 3 being insulated from the bottom plate (field plate) 3' by an electrically insulative material, such as delrin. In an exemplary embodiment, utilizing a 4 inch diameter substrate, substrate holder 4 is nominally 6 inches in diameter and supported on a rotatable shaft 20 which is in turn connected to a motor 18 so that holder 4 and substrate 5 may be rotated during a deposition process. An insulating shaft 22 electrically insulates the substrate holder 4 and substrate 5 supported thereon from the DC voltage applied to the deposition chamber main body 12 so that a DC bias can be created between the substrate holder 4 and barrier plate 6 (via chamber main body 12). Such a DC bias may be utilized, for example, for field-poling of thin films as they are being deposited on the substrate 5. Insulating shaft 22 is connected to shaft 20 and shaft 20' by couplings 21. Electrical source 102 is operatively connected across main body 12 of deposition chamber 2 at connection 108 by lead 106 and via feedthrough 23 to brass sleeve 25 by lead 104 to effect a DC bias between field plate 3' and barrier plate 6.

Barrier plate 6 is made of an electrically conductive material such as stainless steel, and is of sufficiently large size to extend substantially over the substrate 5 in parallel thereto so that a vaporized source or mist as injected through input tube 26 and nozzle assembly 8 is forced to flow between barrier plate 6 and the substrate holder 4 over the substrate 5. Barrier plate 6 is preferably the same diameter as the substrate holder 4. As depicted in FIG. 1, the barrier plate 6 is preferably connected to the lid 14 by a plurality of rods 24 so that the plate 6 will be moved away from the substrate 5 whenever the lid is opened.

Figure 11A:
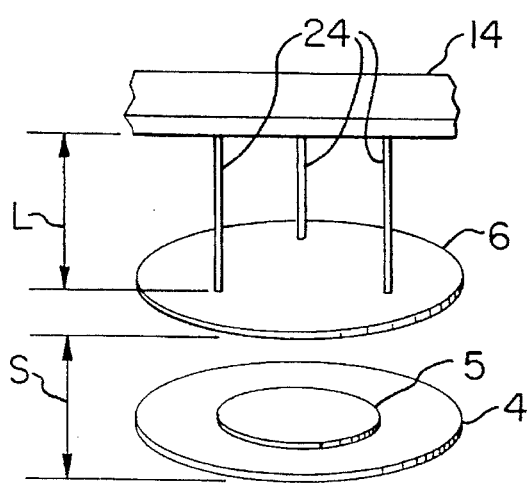
FIGS. 11i aand 11b illustrate several of the possible positions of the adjustable barrier plate.
Figure 11B:
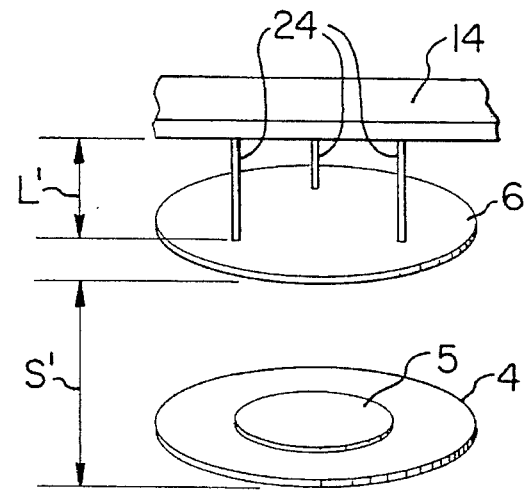

FIGS. 11a and 11b show barrier plate 6 located at various distances from substrate holder 4. Each of the rods 24 is typically a stainless steel rod attached to deposition chamber lid 14. Each rod 24 is bored to accommodate a bolt 35 (FIG. 1) by which the rod 24 is attached to barrier plate 6. Each rod 24 is tapped to accommodate a set screw 36 which secures bolt 35 to the rod 24. By loosening set screw 36, repositioning rod 24 relative to bolt 35, and then retightening set screw 36, the effective length of each rod is adjustable up to ½ inch without having to remove the rod 24 from the chamber lid 14. Each of the rods 24 is removable to allow sets of rods 24 of different lengths L, L', etc to be substituted in order to coarsely adjust the corresponding spacing S, S', etc. between barrier plate 6 and substrate holder 4 (and substrate 5) depending on the source materials, flow rate, etc. For example, the rod length L may be adjusted to provide a spacing S in the range of 0.10–2.00 inches. Once in place, rods 24 are also adjustable as indicated above. Thus, rods 24, bolts 35, and set screws 36 comprise an adjusting means for adjusting the barrier plate 6. The spacing between substrate holder 4 and barrier plate 6 is preferably approximately between 0.375 inches and 0.4 inches when a precursor liquid of barium strontium titanate, as prepared below, is to be deposited.

Figure 7:
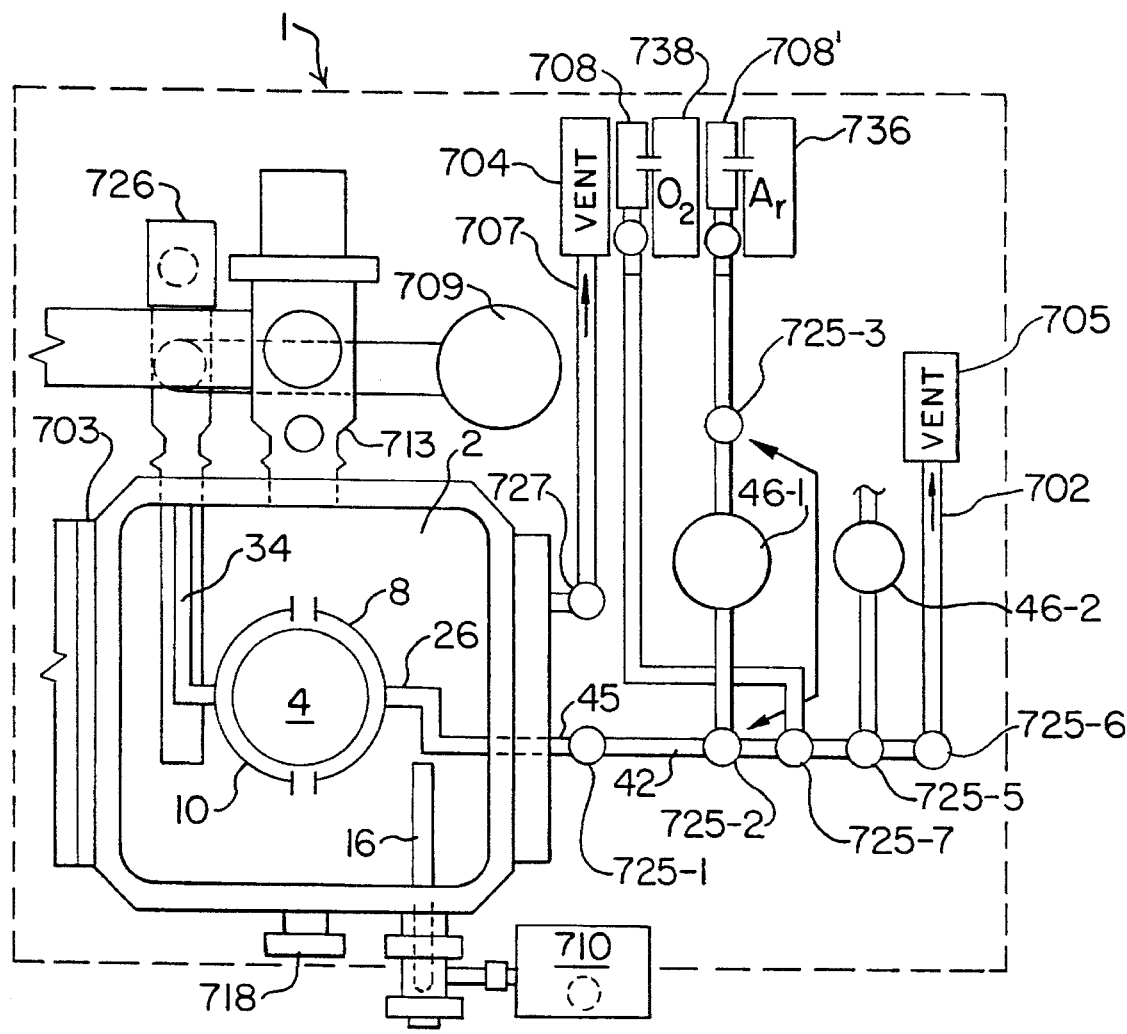
FIG. 7 is a top view of the apparatus of an exemplary embodiment of the invention.
Figure 9:
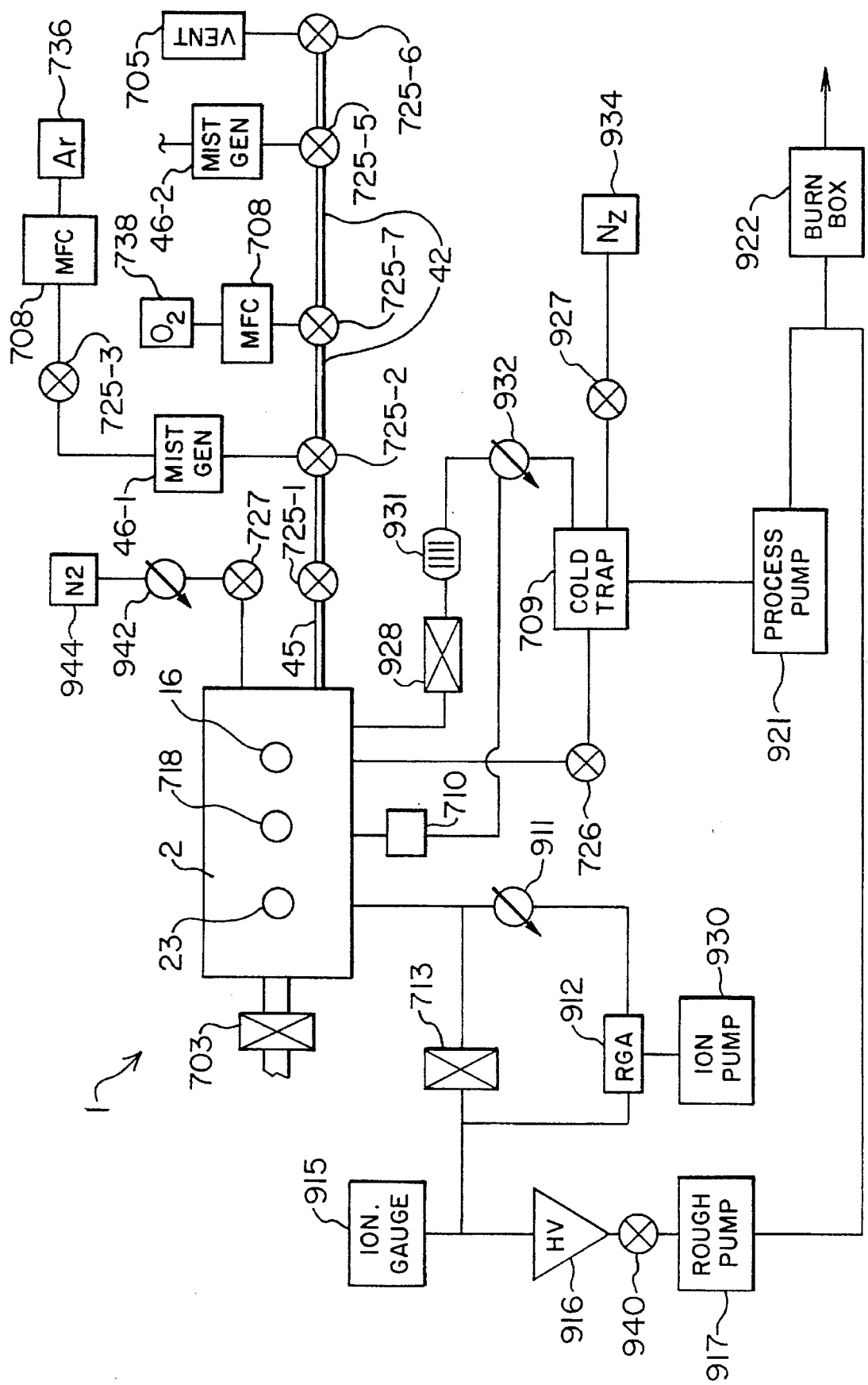
FIG. 9 is a schematic view of the apparatus corresponding to the embodiment of FIG. 7.

FIG. 7 is a top view of the apparatus of an exemplary embodiment of the invention, and FIG. 9 is a schematic view of the apparatus corresponding to the embodiment of FIG. 7. As shown in FIG. 7, a 0–1000 Torr temperature compensated capacitance manometer 710 monitors the pressure in deposition chamber 2, and its signal controls a downstream control valve 932 to maintain precise pressures in deposition chamber 2. As shown in FIG. 9, deposition chamber 2 is rough-pumped by vacuum pump 921, which in one embodiment is an Alcatel 2-stage, 11 CFM mechanical fore pump. After being rough-pumped, deposition chamber 2 is high vacuum pumped through a vacuum pump 916 such as a C.T.I. Cryo-Torr 100 high vacuum pump. Other turbomolecular or cryogenic pumps could also be used for high vacuum pumping. High vacuum pump-down of deposition chamber 2 to below $5.0 \times 10^{-6}$ Torr is accomplished with valve 713 opened, using high vacuum pump 916, with valve 940 closed. High vacuum pump 916 is backed by pump 917 which is used as needed (typically every two weeks) for regeneration of pump 916, with valve 940 opened for this operation only. Ionization gauge 915 is used to monitor the vacuum in chamber 2. High vacuum pump-down of deposition chamber 2 is used to facilitate adsorption of moisture from the chamber walls as well as from a substrate 5 located inside of the chamber, prior to a deposition operation.

As shown in FIGS. 7 and 9, an RGA (residual gas analyzer) 712 is provided for analyzing the decomposition products within deposition chamber 2 from one atmosphere to extremely low pressures. Mass resolution of up to 300 AMU is provided. In an exemplary embodiment, RGA 712 is a U.T.I. residual gas analyzer, connected to a Varian Associates 10 LPS ion pump 930.

Valves 727 and 942 are used to vent nitrogen from source 944 into the deposition chamber 2 for the purpose of back filling the chamber 2. Valve 942 is a needle valve which is used to precisely regulate the flow of nitrogen into the chamber 2.

Deposition chamber 2 is vacuum pumped to a pressure of between approximately 200 and 600 Torr during a deposition operation by means of process pump 921. The deposition chamber exhaust system include, in addition to pump 921, a liquid nitrogen cold trap 709, and an MKS control valve 932 with controller and manual valve. Cold trap 709 may be purged with dry nitrogen from source 934. A Dayton solenoid valve 927 is used to back fill the roughing line with the dry nitrogen gas. Cold trap 709 is connected to process chamber 2 via valve 726, and also via needle valve 932, filter 931 and process line valve 928. The deposition chamber effluents are directed to a burn box and scrubber combination 922 to assure safe disposal of any toxic corrosive and flammable vapors.

Access to an external chamber (not shown) from deposition chamber 2 is provided through an air-operated slit valve 703. The interior of deposition chamber 2 can be viewed during a deposition operation through view port 718.

The precursor liquids are provided with mass flow controller 708 and VCR valve 725-3 to control the dispersion rates of source materials through manifold assembly 40 into deposition chamber 2 by regulating the flow of an inert gas such as argon from source 736 into mist generator 46. Additional gas source, mass flow controller, and valve inputs (not shown) can be connected to mist generator 46', which connects to manifold assembly 40 via VCR valve 725-5. A separate mass flow controller 708' is used to introduce oxygen from source 738 and/or other inert or process-active gases into manifold assembly 40 via VCR valve 725-7.

Figure 2:
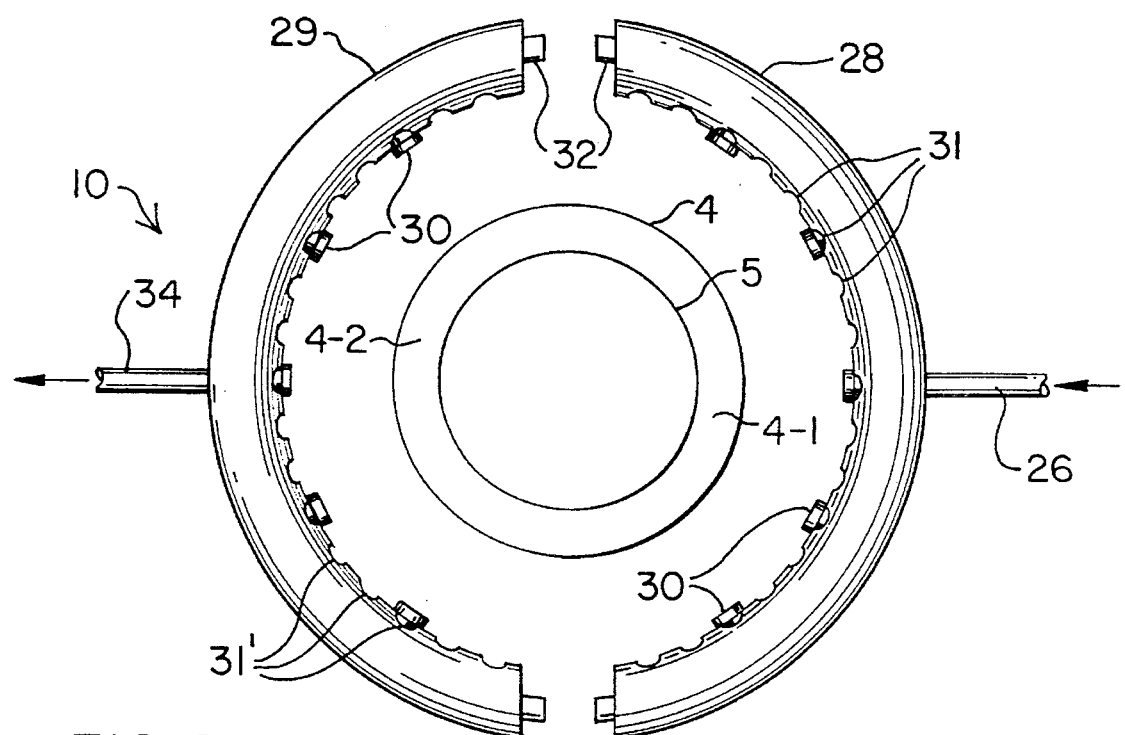
FIG. 2 is an enlarged plan view of an intake and exhaust nozzle assembly.

The input nozzle assembly 8 and the exhaust nozzle assembly 10 are more particularly shown with reference to FIG. 2. Input nozzle assembly 8 includes an input tube 26 which receives a misted solution from manifold assembly 40 as discussed below in relation to FIG. 3. Input tube 26 is connected to arcuate tube 28 which has a plurality of small holes or input ports 31 for accepting removable screws 30 spaced ¼ inch center-to-center along the inner circumference of the tube 28.

Exhaust nozzle assembly 10 comprises an arcuate exhaust tube 29 having a plurality of small holes or exhaust ports 31' with removable screws 30. The structure of the exhaust nozzle assembly 10 is substantially the same as that of the input nozzle assembly 8, except that a tube 34 leads to a vacuum/exhaust source (not shown). End caps 32 of tubes 28 and 29 are removable for cleaning. Arcuate tube 28 of input nozzle assembly 8 and the corresponding arcuate tube 29 of exhaust nozzle assembly 10 respectively surround oppositely disposed peripheral portions 4-1, 4-2 of substrate holder 4.

In an exemplary embodiment wherein a BST film is to be deposited, the centers of holes 31, 31' in tubes 28 and 29 are nominally located 0.375 inches above substrate holder 4. However, as shown in FIGS. 11A and 11B below, this distance is adjustable to suit the specific deposition process.

Each of the tubes 28, 29, is typically fabricated from ¼" O.D. stainless steel, with an inner diameter of approximately ³⁄₁₆". The interior walls of each tube 28,29 are preferably electro-polished. Holes 31, 31' in tubes 28 and 29 respectively are spaced approximately ¼' center-to-center, and are tapped to accommodate 4-40 (⅛") socket head set screws.

Through such structure, and by adjusting the location of open holes 31, 31' by selectively inserting or removing screws 30 in the two arcuate tubes 28 and 29, the flow of a vaporized solution or mist over the substrate 5 can be well controlled for various solutions and flow rates, etc., to achieve a uniform deposition of a thin film on substrate 5.

Referring to FIGS. 1 and 2, substrate holder 4, barrier plate 6, input nozzle assembly 8 and exhaust nozzle assembly 10 collectively cooperate to define a relatively small, semi-enclosed deposition area 17 surrounding an upper/exposed surface of the substrate 5, and within which the vaporized solution is substantially contained throughout the deposition process.

Although exemplary embodiments of substrate holder 4, barrier plate 6, input nozzle assembly 8 and exhaust nozzle assembly 10 are shown and described, it is understood that variations of such structures can be utilized within the scope of the present invention. For example, the arcuate input and exhaust tubes 28 and 29 could be replaced with tubes of other structures such as V-shaped or U-shaped tubes, or slotted tubes, or could simply be replaced by a plurality of separate nozzles and separate exhaust ports.

Figure 3:
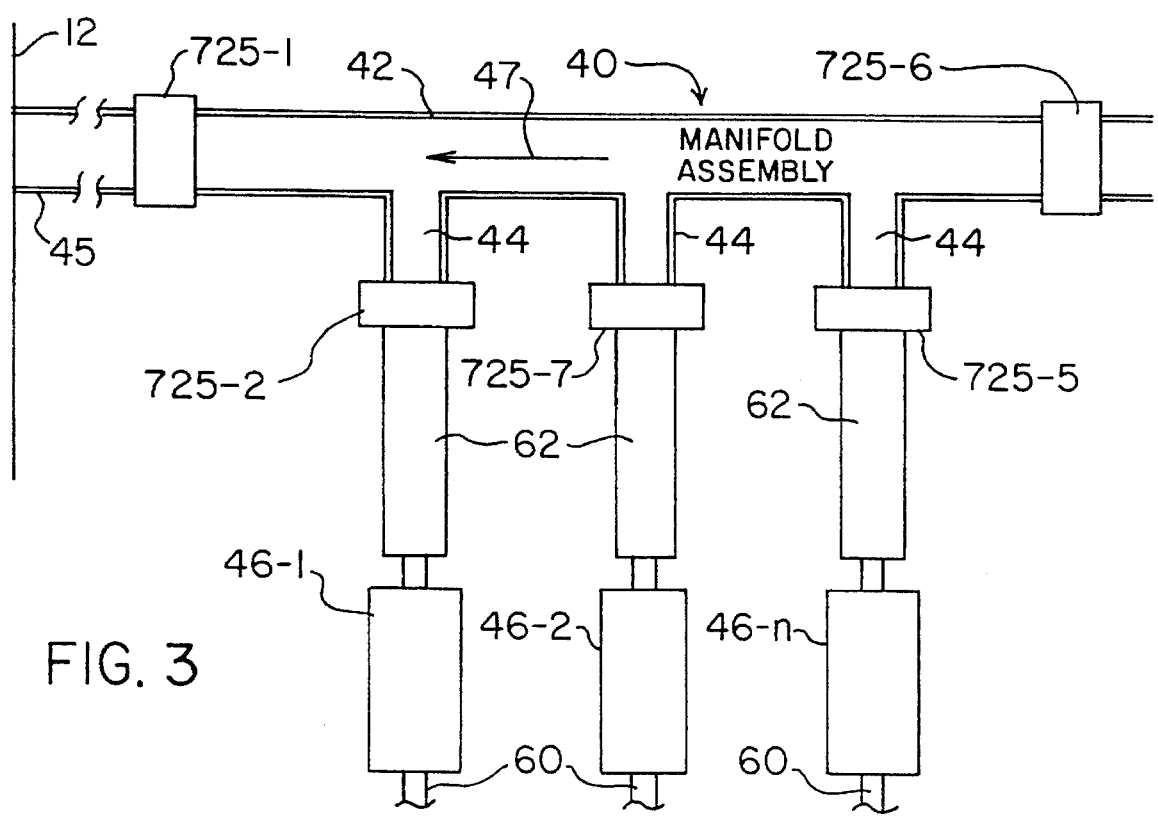
FIG. 3 is an enlarged schematic top view of a manifold system used in the invention.

FIG. 3 shows a manifold assembly 40 according to the present invention. The manifold assembly 40 is utilized for supplying a vaporized solution (mist or aerosol) to input nozzle assembly 8, and generally comprises a mixing chamber 42, a plurality of inlets 44 which are connected to corresponding mist generators through respective valves 725-2, 725-5, 725-7, a deposit valve 725-1 for regulating flow from the mixing chamber 42 to the nozzle assembly 8, and an exhaust vent valve 725-6.

In use, one or more of the mist generators 46-* are utilized to generate one or more different mists which are then flowed into the mixing chamber 42 through valves 725-* and inlets 44.

The mists as flowed into the mixing chamber 42 are mixed to form a single, uniform misted solution which is then flowed into the deposition chamber 2 at an appropriate flow rate through the valve 725-1 and input tube 26. Valve 725-1 can be selectively closed off so that the deposition chamber 2 can be pumped down if desired, or to clean and purge the manifold system when necessary. Similarly, the outlet of the exhaust valve 725-6 is connected to a vacuum source (not shown) so that, when necessary to exhaust/purge one or more of the mist generators 46, valve 725-1 can be closed off, valve 725-6 and one or more of the valves 725-* can be opened, and the mixing chamber 42 can be pumped down to clean and purge the mist generator(s) 46 and the mixing chamber 42 by applying a vacuum via pump 921 and/or pump 916, or using standard negative draw type exhaust.

An important aspect of the invention is that stabilized precursor solutions are agitated ultrasonically to atomize or nebulize the solutions before they are introduced into the deposition chamber 2. This atomization produces a mist of the stabilized precursor solution(s) which provides an important basis for the improved operation of the present invention.

Figure 4A:
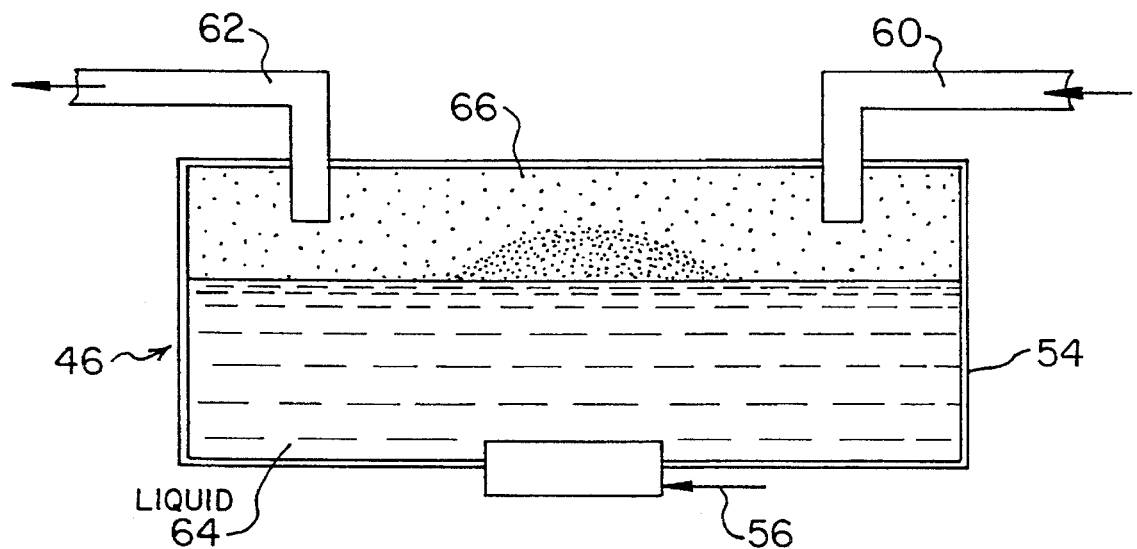
FIG. 4a is a schematic side view of a mist generating apparatus used in the present invention.
Figure 4B:
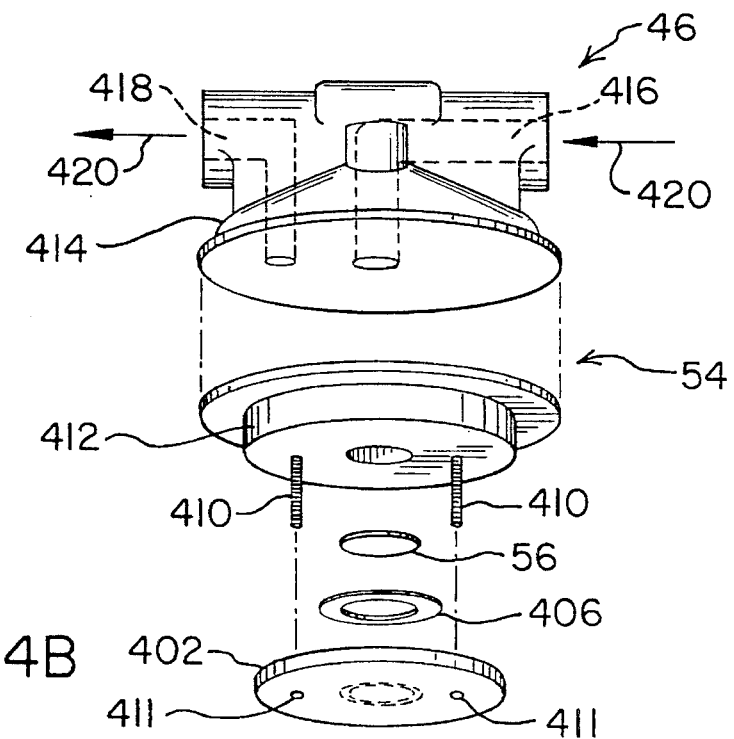

FIG. 4a illustrates a schematic side view of an exemplary embodiment of the mist generating apparatus used in the present invention. FIG. 4b is an exploded view of the mist generating apparatus of FIG. 4a. As shown in FIGS. 4a and 4b, mist generator 46 includes a closed container 54, a TDK TU-26B or equivalent ultrasonic transducer 56 fluid-tightly and vacuum sealed into the bottom of the container 54. Container 54 is a modified Millipore Waferguard T-Line gas filter unit (catalog no. YY50 005 00) without the internal filter cartridge. The direction of gas flow as indicated by arrows 420 is opposite to that which would be used in normal operation of the filter. Transducer 56 is mounted in a recessed hole in bottom section 412 of mist generator 46 and is affixed to section 412 by two 8-32 threaded studs which pass through holes 411 in a delrin mounting block 402. A teflon "O" ring 404 and teflon seal 406 provide a pressure- and vacuum-tight seal between the transducer 56 and the inside of container 54. Mist generator 46 also includes an inlet port 60 and an outlet port 62 for passing a carrier gas through the container 54.

Before operation, a predetermined amount of precursor liquid 64 is introduced into container 54 after separating bottom section 412 from top section 414 of container 54. During operation, transducer 56 is electrically activated to generate a mist 66 of the precursor liquid, and an inert carrier gas is passed into the mist 66 via port 60 where it becomes wet or saturated with the mist, and the wet carrier gas is then passed from the outlet port 62 into the manifold assembly 40. The carrier gas is normally an inert gas such as argon, helium, or nitrogen, but may comprise a reactive gas in appropriate situations.

The mist generator 46 shown in FIGS. 4a and 4b is particularly advantageous because it creates a vaporized solution which can be effectively flowed or injected into the deposition chamber 2 without complications such as freezing.

Figure 5A:
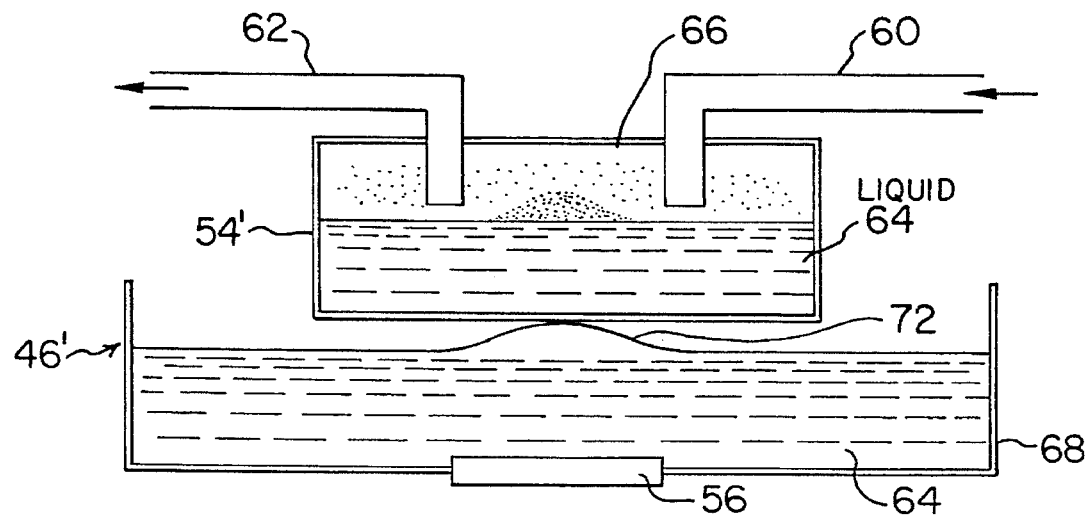

FIG. 5a shows a mist generator 46' which is modification of the mist generator 46 shown in FIGS. 4a and 4b whereby the ultrasonic transducer 56 does not come into contact with the precursor liquid 64. Instead, the precursor liquid 64 is contained within a first, closed container 54' while the transducer 56 is sealingly fitted to a bottom wall of a second, open container 68, a working medium 70 such as water or another liquid is disposed in the second container 68 over the transducer, and the first container 54' is disposed in spaced relation above an upper surface of the working medium 70 such that a mist plume 72 of the working medium created by the ultrasonic transducer contacts a bottom wall of the first container 54' for thereby creating the mist 66 of the liquid precursor 64 within the first container 54', which is then flowed into the manifold assembly 40 in the same manner as discussed above in relation to FIGS. 4a and 4b. The modified mist generator 46' shown in FIG. 5 has all of the advantages of the mist generator 46 shown in FIGS. 4a and 4b, as well as an additional advantage that the ultrasonic transducer 56 does not become contaminated with a liquid used to form a desired thin film.

Figure 5B:
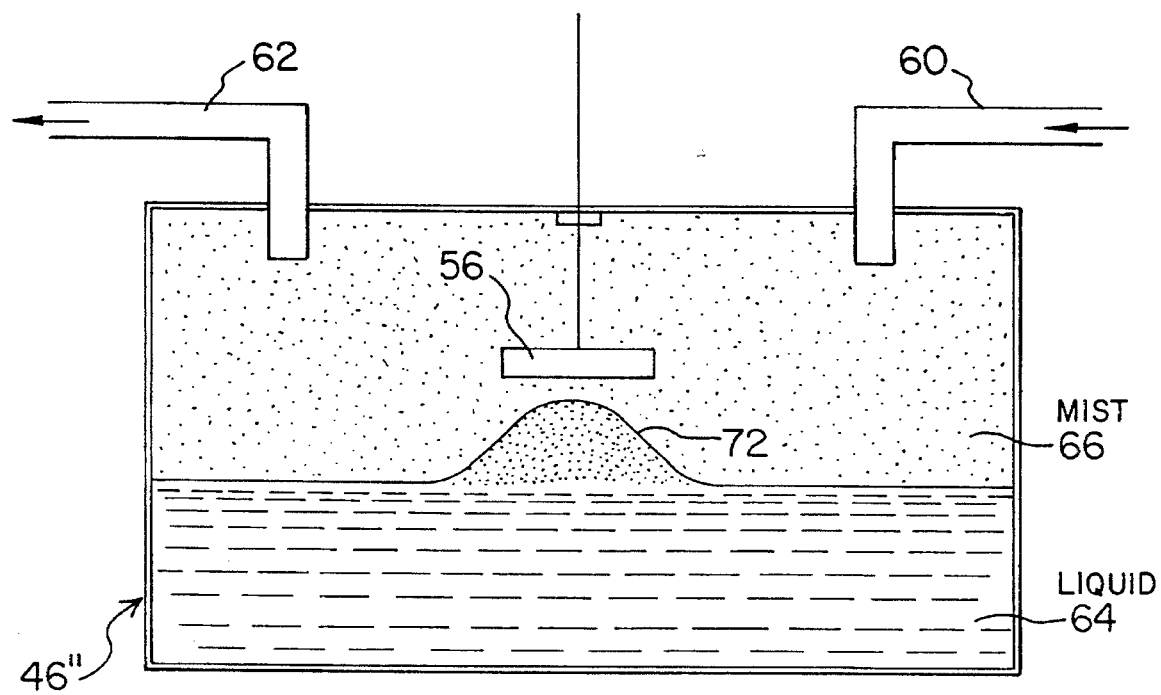

FIG. 5b illustrates another modification of the mist generating apparatus of FIGS. 4a and 4b. The modification of FIG. 5b is very similar to that of FIGS. 4a and 4b, except that the transducer 56 is suspended in the generator 46" above the precursor liquid rather than being sealed into the bottom wall of the container.

Although the mist generators 46, 46', 46" shown in FIGS. 4a, 4b, 5a and 5b are preferred according to the invention, it will be understood that other mist generators could be utilized according to the invention. For example, a spray nozzle could be used to generate a mist of a precursor liquid within a closed container, and an appropriate carrier gas could be flowed through the mist and into the mixing chamber 40 using an inlet and outlet port similar to the ports 60, 62 shown in FIG. 4a and 4b.

Figure 10:
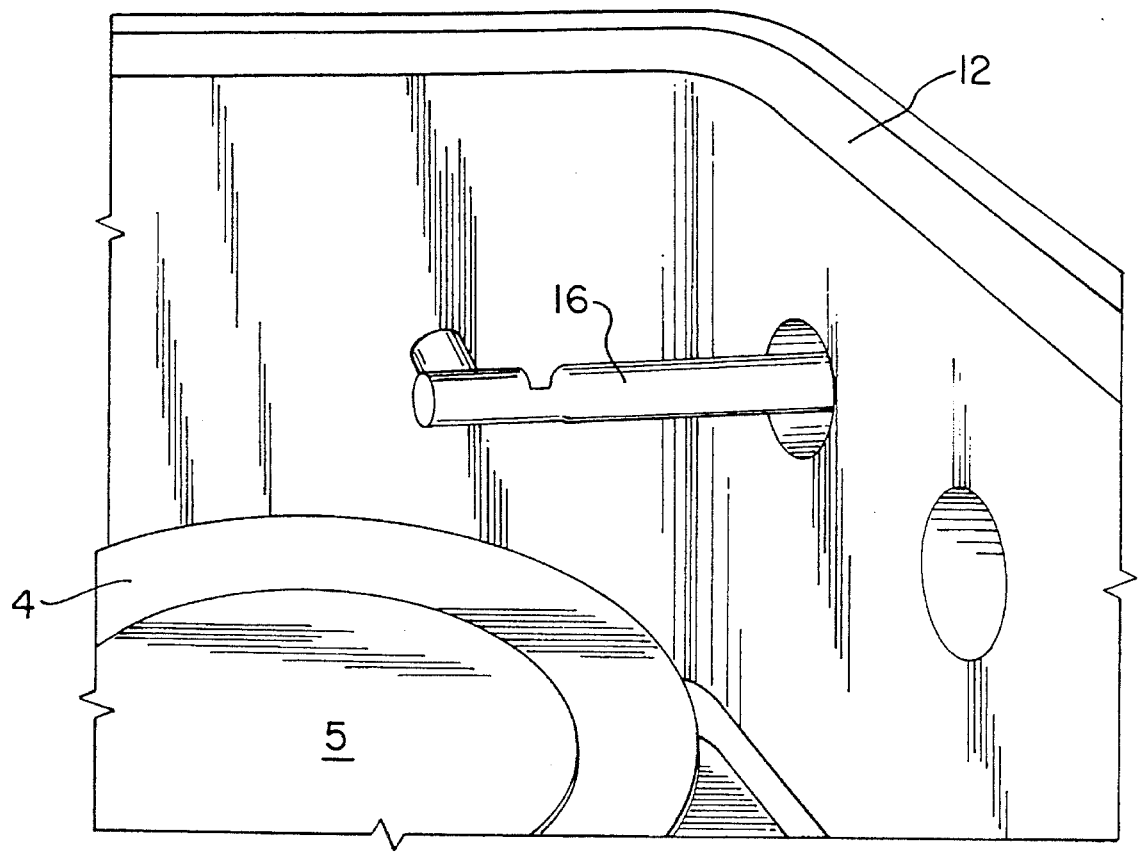
FIG. 10 is a perspective view showing the placement of the ultraviolet radiation source within the deposition chamber.

FIG. 10 is a perspective view showing the placement of an ultraviolet radiation source 16 within the deposition chamber 2. Photo-enhancement of the present process is effected by providing UV (ultraviolet) light during and after the deposition process which is believed to stimulate the disassociation of solvent and organics from the precursor, thereby accelerating the drying process. In addition, the use of UV radiation prior to the deposition process facilitates the removal (desorption) of moisture from deposition chamber 2 as well as from substrate 5. The location of ultraviolet light source 16 within the deposition chamber is not critical because of the fact that the ultraviolet radiation is reflected off of the stainless steel walls of deposition chamber 2 into the space between the input nozzle 8 and exhaust nozzle 10, as well as onto substrate 5, where the radiation can provide the above-described photo-enhancement effect.

UV source 16 includes at least one UV lamp located in deposition chamber 2, for applying an ultraviolet radiation bath therein. Spectral sources which could be used in means 108 include ultraviolet lamps and excimer lasers. In either case, the radiation bath applied by UV source 16 is tuned to optimize the dissociation of the desired chemical compound from the solvent and the organics or other fragments. In the first case, radiation emitted by an excimer laser is spectrally "tuned" to correspond to the energy needed to dissociate or crack the solvent bonds, the precursor chemical compound bonds and/or any intermediate organic complex bonds formed during the deposition process holding the desired compound in a given precursor liquid. Alternatively, if UV source 16 is a UV lamp (or plurality of lamps), then "tuning" is accomplished by exchanging one (or a set of) the UV lamps with another one of (or set of) UV lamps which have a more desirable frequency spectrum.

If a ferroelectric thin film is being deposited from a vaporized sol-gel source, for example barium strontium titanate (BST), it is preferable to use a Danielson Phototron PSM-275 UV radiation source 16 Which emits UV radiation rays having a wavelength of approximately 180–260 nanometers. UV radiation in this wavelength range is particularly effective in resonating and dissociating the hydroxyl bonds holding the BST in the vaporized sol-gel, MOD, or other liquid chemical source.

Apparatus 1 shown in FIGS. 1, 7, and 9 includes electrical means 102 for applying a DC bias in the deposition chamber 2 during a deposition operation. FIG. 1 shows the DC input 104. The DC potential applied between input sleeve 25 and deposition chamber main body 12 is typically 350 volts. The DC bias achieves poling in-situ of the ferroelectric film adding to the film quality. Dipole ordering along the crystal c-axis (the major polarization axis) is often desirable, and the resulting ordering reduces dislocation density which can be responsible for fatigue and retention problems.

A DC bias of either greater than or less than 350 volts could also be used to effectuate the above results. In addition, while deposition is occurring, combinations of ultraviolet radiation and DC bias may be applied within chamber 2 either together or sequentially, and repeated.

Figure 6:
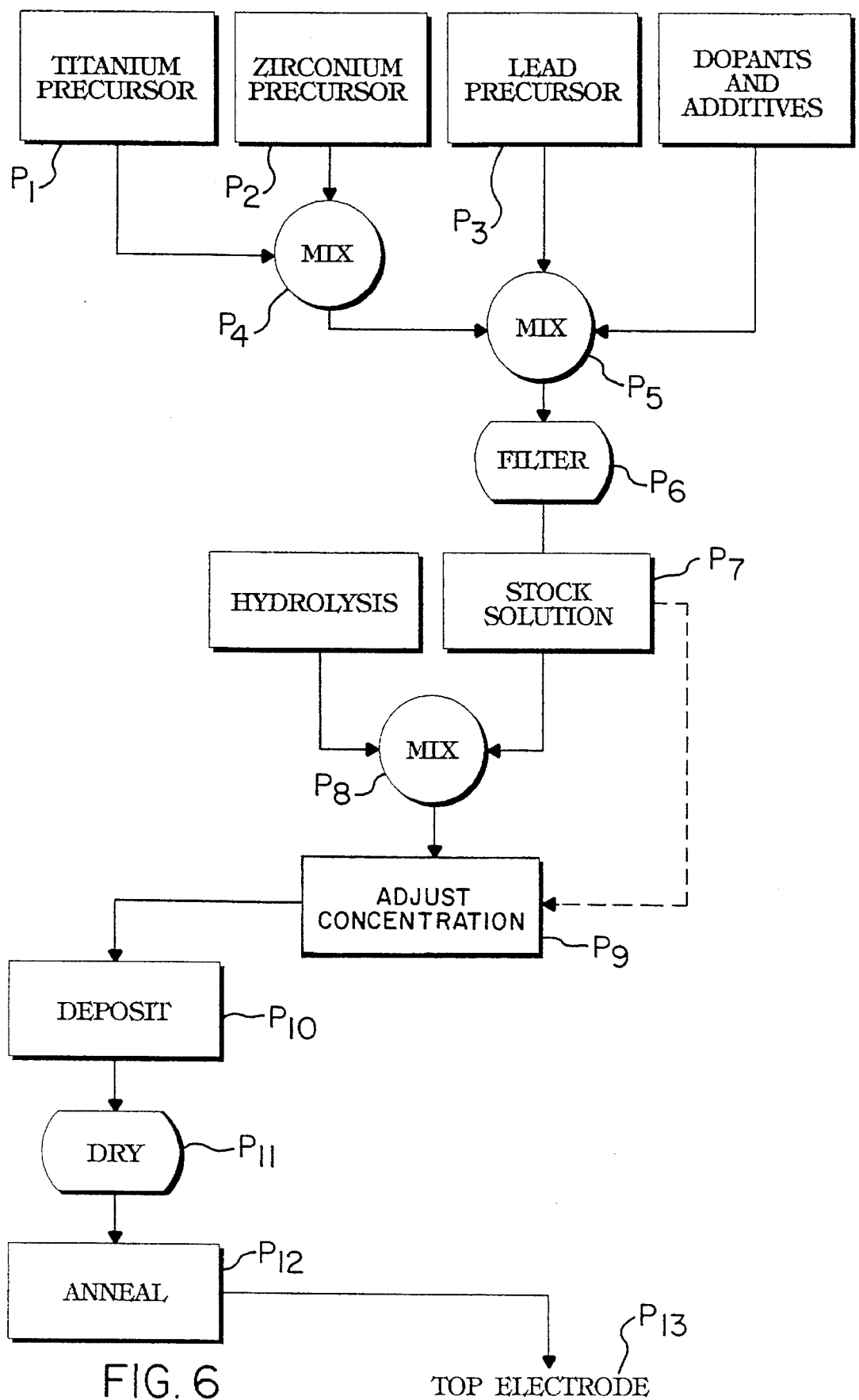
FIG. 6 is a flow chart showing the preparation of a lead zirconium titanate precursor according to the present invention.

A supplemental heating means, such as a hot plate, (not shown) may be used to bake and/or anneal a film of a precursor liquid which has previously been deposited on a substrate, the baking and annealing being preferably conducted in an auxiliary chamber, although the baking/annealing process could be performed within the deposition chamber 12, as discussed in relation to steps $P_{11}$ and $P_{12}$ of FIG. 6. The annealing is preferably performed in an oxygen furnace. High energy density ultraviolet radiation, such as from a diffused excimer laser source is also a preferred method of annealing.

Examples of the Process

Referring to FIG. 6, there is shown an exemplary flow chart depicting the preparation of a stabilized liquid precursor of lead zirconium titanate (PZT hereinafter) to be deposited utilizing the apparatus of FIGS. 1–5. At steps $P_1$–$P_3$ stabilized liquid precursors of titanium isopropoxide, zirconium N-propoxide and lead acetate are respectively formed utilizing 2-methoxyethanol as the common solvent of each of the precursors. At step $P_4$ the precursor liquids of titanium isopropoxide and zirconium n-propoxide are mixed, while at step $P_5$ such mixture is further mixed with the precursor liquid of lead acetate precursor together with dopants or additives (if any) desired in the thin film to be deposited. At step $P_6$ the final mixture of $P_5$ is filtered to form a stock solution as shown in $P_7$. A more detailed analysis of steps $P_1$–$P_7$ are presented below.

A sol-gel PZT (lead zirconium titanate) solution was generated in accordance with the following steps:

The lead precursor was formed by adding 94.73 gm $Pb(O_2CCH_3)_2 \cdot 3H_2O$ (0.25 moles Pb) to 197 ml 2-methoxyethanol. The solution was distilled to a final vapor temperature of 114° C. to yield a final distillate of 107 1 ml.

The zirconium precursor was formed by adding 46.82 gm Zr n-propoxide in 30% propanol by weight (0.10 moles Zr) to 79 ml 2-methoxyethanol and distilling the solution to a final vapor temperature of 113° C., yielding 79 ml of final distillate. During this procedure, the n-propoxide ligands on Zr are replaced by 2-methoxyethoxide ligands.

The titanium precursor was formed by adding 42.62 gm Ti-isopropoxide (0.15 moles Ti) to 118 ml 2-methoxyethanol. The solution was distilled to a final vapor temperature of 114° C., yielding 76 ml of final distillate. During this procedure, the isoprop-oxide ligands are replaced by 2-methoxyethoxide ligands.

The above precursors were then mixed as follows. The Ti precursor was added to the Zr precursor and stirred while heating at a low heat of approximately 100° C. The TiZr solution was added to the Pb solution and heated at a low heat of approximately 100° C. while stirring for ½ hour. The amount of the resulting PZT stock solution was 250 ml. The PZT stock solution was then filtered through an appropriate size syringe filter. The resulting molarity of the solution was 1.0M (moles PZT/L of solution) with a 10:1 mole ratio of 2-methoxyethanol to metal.

At step $P_8$, which is optional, the stock solution of $P_7$ is hydrolyzed using acetic acid and $H_2O$ or other appropriate materials, although such hydrolyzation step may be omitted as indicated by the dotted line extending from $P_{7\ to\ P_9}$. The steps $P_1$ through $P_8$ are conventional steps utilized in forming sol-gels used in conventional spin-on thin film forming procedures.

At step $P_9$, the conventional stock solution of $P_7$ or the conventional hydrolyzed solution of $P_8$ are modified for use in the deposition processes of the present invention.

Such step $P_9$ essentially involves adjusting the concentration of the desired chemical compound in the sol-gel, or other precursor liquid, such that small droplets of the vaporized source (mist) as flowed into the deposition chamber 2 will deposit onto the substrate 5, spread out and interconnect to form a uniform film of the sol-gel over the entire upper surface of the substrate 5. In other words, the sol-gel concentration will be adjusted such that a film of the sol-gel will deposit completely over the substrate 5 before a significant amount of drying of the individual droplets occur, which would undesirably result in the creation of small disconnected particles on the substrate, the particles ultimately resulting in a thin film which is very porous and/or granular. Determination of the appropriate concentration of chemical compound in the sol-gel or other precursor liquid involves considerations of the particular chemical compound and solvent used in the precursor liquid, as well as of the vacuum level maintained within the deposition chamber 2. For example, solvents having relatively high boiling points, such as 2-methoxyethanol used in the PZT sol-gel discussed above, are slower to dry than solvents having relatively low boiling points such as methanol. Higher vacuum levels result in faster drying of any given precursor liquid.

With the deposition of PZT from a sol-gel as prepared in the manner discussed above, and with the deposition chamber 2 operating at a vacuum of 570–575 Torr, it is preferred that the stock solution of $P_7$ or the hydrolyzed solution of $P_8$ will be modified in step $P_9$ by the addition of 10–15 percent (by volume) of methanol. In other words, the normal sol-gel is diluted to a sufficient degree to assure that the small droplets of the vaporized solution which deposit on the substrate 5 are sufficiently fluid to spread out and interconnect to form a continuous, uniform film as discussed above.

Although methanol is the preferred diluent for the sol-gel of PZT according to the present invention, it will be understood that other diluents (including 2-methoxyethanol) could be used for diluting the sol-gel of PZT, and that various other diluents would be utilized with other sol-gels and with other precursor liquids used according to the present invention.

At step $P_{10}$ the modified solution of step $P_9$ is misted using a mist generator 46 such as shown in FIGS. 4 or 5, and is flowed into the deposition apparatus 1 through the manifold assembly 40 where it is deposited on the substrate 5 to form a thin film of the sol-gel. The thickness of the deposited thin film is monitored by conventional means (not shown). The term "substrate", as used herein, includes any layers of material deposited on the actual silicon substrate, in addition to the silicon substrate itself, as described below in relation to FIGS. 12a and 12b.

At drying step $P_{11}$ the substrate 5 having a thin film of the sol-gel or other precursor liquid thereon is subjected to vacuum to remove the solvent from the sol-gel, thus leaving a thin film of the desired chemical compound on the substrate, while at step $P_{12}$ the thin film of the chemical compound will, if necessary, be annealed. In drying step $P_{11}$, drying of the sol-gel film may alternatively be accomplished by using a heating means to bake or otherwise heat the deposited film. Further, with many complex thin films, such as ferroelectrics, it is necessary to anneal the dried thin films before the films will function in a desired manner. The drying and annealing steps $P_{11}$, $P_{12}$ may be effected within the deposition chamber 2 using appropriate heating means, as discussed below in relation to further embodiments of the invention, or may be performed in different apparatus, such as a hot plate, outside of the deposition chamber 2.

At step $P_{13}$ the substrate having a thin film of the chemical compound thereon is further processed, such as by having a top electrode deposited thereon. The apparatus of the first embodiment of the present invention, as discussed above in relation to FIGS. 1–5 is very advantageous because it readily produces very complex, multi-element films in a controlled environment. Some specific advantages include the ability to carefully, consistently control the stoichiometry of thin films being deposited, the relative ease with which precursor liquids may be generated and handled, the ability to keep the deposited films free from contaminants (because the deposition process is operated under vacuum conditions), and the ability to form very thin, uniform films fully covering a substrate surface.

A detailed example of the process of preparing barium strontium titanate (BST) precursors and fabricating a capacitor utilizing BST as the capacitor dielectric follows. In Table I, "FW" indicates

TABLE I

| | $Ba_{0.7}Sr_{0.3}TiO_3$ | | | |
|---|---|---|---|---|
| Compound | FW | grams | mmole | Equiv. |
| Barium | 137.327 | 9.4255 | 68.635 | 0.69986 |
| 2-ethylhexanoic acid | 144.21 | 19.831 | 137.51 | 1.4022 |
| Strontium | 87.62 | 2.5790 | 29.434 | 0.30014 |
| 2-ethylhexanoic acid | 144.21 | 8.5005 | 58.945 | 0.60107 |
| Titanium isopropoxide | 284.26 | 27.878 | 98.072 | 1.0000 | formula weight, "grams" the weight in grams, "mmoles" indicates millimoles, and "Equiv." indicates the equivalent number of moles in solution. The quantities of materials as indicated in Table I were measured. The barium was placed in 100 ml of 2-methoxyethanol and allow to react. The first measure of 2-ethylhexanoic acid was added to the mixture and stirred. The strontium was then added to the mixture. Once it was finished reacting, the second measure of the 2-ethylhexanoic acid was added to the mixture. The mixture was heated to a maximum temperature of 115° C. and stirred to distill out all water. The mixture was allowed to cool. The titanium isopropoxide was added to the mixture, which was then diluted to 220 ml with additional 2-methoxyethanol. The mixture was heated to a maximum temperature of 116° C. and stirred. All isopropanol and water were then distilled out. The mixture was then diluted out to exactly 200 ml with additional 2-methoxyethanol. The resultant mixture had a 0.490M concentration, wherein the ratio of Ba to Sr=0.69986:0.30014.

The chemical reactions involved in the formation of the precursor solution composed of barium 2-ethylhexanoate, strontium 2-ethylhexanoate, and titanium 2-methoxyethoxide are described below:

1. Barium 2-ethylhexanoate (barium metal)+(2-ethylhexanoic acid)→ (barium 2-ethylhexanoate)+(hydrogen gas):

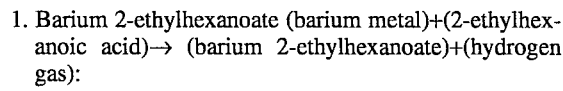

2. Strontium 2-ethylhexanoate (strontium metal)+(2-ethylhexanoic acid)→(strontium 2-ethylhexanoate)+(hydrogen gas):

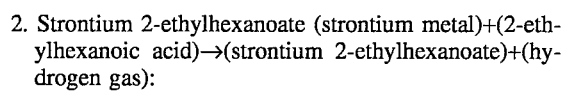

3. Titanium 2-methoxyethoxide (titanium isopropoxide)+ (2-methoxyethanol)→(titanium 2-methoxyethoxide)+ (isopropyl alcohol):

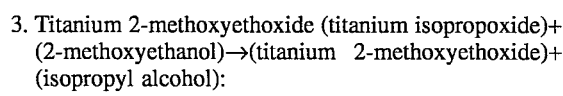
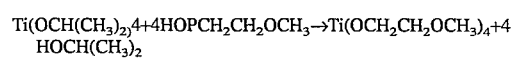

The use of 2-methoxyethanol as a solvent allows removal of any water present by distillation, as 2-methoxyethanol's higher boiling point allows it to remain behind while H$_2$O boils away. Barium and strontium 2-ethylhexanoate are used because thin films formed utilizing medium chain length carboxylates like these in the precursors do not crack, blister or peel on baking as do the thin films formed utilizing longer-chain carboxylates. Strontium and barium 2-methoxyethoxides were tried, but proved excessively air- and water-sensitive. Titanium 2-methoxyethoxide gives better films than the air-insensitive titanium 2-ethylhexanoate, but while titanium 2-methoxyethoxide is air-sensitive, it is less air-sensitive than titanium isopropoxide.

The BST precursor formed as described above was used in the method and apparatus of the invention to fabricate a capacitor as described below in relation to FIGS. 12a and 12b. The misted BST precursor solution was flowed onto a platinum layer 1228 which has been previously deposited on top of a layer 1224 of SiO$_2$ which was, in turn, deposited on a silicon wafer substrate 1222. Typically, the SiO$_2$ layer is etched prior to the deposition of the platinum layer to form the shape necessary to create a given integrated circuit device after deposition of appropriate layers of BST and platinum.

A BST precursor as described above was placed in container 54 of mist generator 46. Initially, a substrate comprising a silicon wafer with layers of silicon dioxide and platinum deposited on it was pre-baked on a hot plate at atmospheric pressure (@ Colorado Springs, Colo.) at 400 degrees C. for 10 minutes. The substrate was placed in the deposition chamber on the substrate holder. The deposition chamber was pumped down to 10$^{-6}$ Torr using rough pump 921 via valve 726 and high vacuum pump 916 via valve 713. A 350 volt DC bias was applied between sleeve 25 and the main body 12 of the deposition chamber. Next, substrate rotation motor 18 was turned on to rotate substrate holder 4. UV source 16 was then turned on for 30 minutes to desorb the moisture in the deposition chamber as well as any moisture on the substrate. High vacuum valve 713 was then closed off, and the deposition chamber was slowly back filled via valves 727 and 942 with an inert gas source 944 such as argon or nitrogen to a pressure of approximately 595 Torr. Next, the process vacuum line was opened by opening exhaust throttle valve 928, filter 931, and needle valve 932 to stabilize the deposition chamber pressure at approximately 595 Torr. Injection valve 725-1 and deposit valve 725-2 were then opened and valve 725-6 was closed to start the flow of argon from source 736 through ultrasonic mist generator 46 which was then turned on for 30 minutes to cause a film of approximately 1500 Angstroms to be deposited at ambient temperature on the substrate. The deposition process used argon carrier gas to flow the BST precursor mist over the substrate. After a sufficient film of the BST precursor was deposited on the substrate to produce a thin film, the mist generator, UV source, and substrate rotation motor were turned off. Deposit valve 725-1 was then closed, valve 725-6 was then opened and transducer 56 was turned off, to vent manifold 42 through vent 705 until mist generator 46-1 reached ambient temperature. Manifold 42 was purged through vent 705 by applying argon gas from source 736.

While the wafer remained in the deposition chamber, the chamber was slowly pumped down to 0.4 Torr for ½ hour using pump 921. During the slow-pumping, valve 928, filter 931, and valve 932 remained open until the chamber pressure reached 0.4 Torr. Thereafter, valve 928 was closed and valve 713 was opened to allow high-vacuum pump 916 to pump the deposition chamber 2 down to 10$^{-6}$ torr for 10 minutes. Next, valve 713 was closed and the deposition chamber was vented to atmospheric pressure by opening vent valve 727. The wafer was then removed from the deposition chamber and post-baked at 400 degrees C. for two minutes. The wafer was then annealed in an oxygen atmosphere at 750 degrees C. for 60 minutes. The wafer was then etched using well-known photo-resist techniques to produce a plurality of electronic devises, as is further described below.

Devices As May Be Fabricated Utilizing the Invention

Figure 12A:
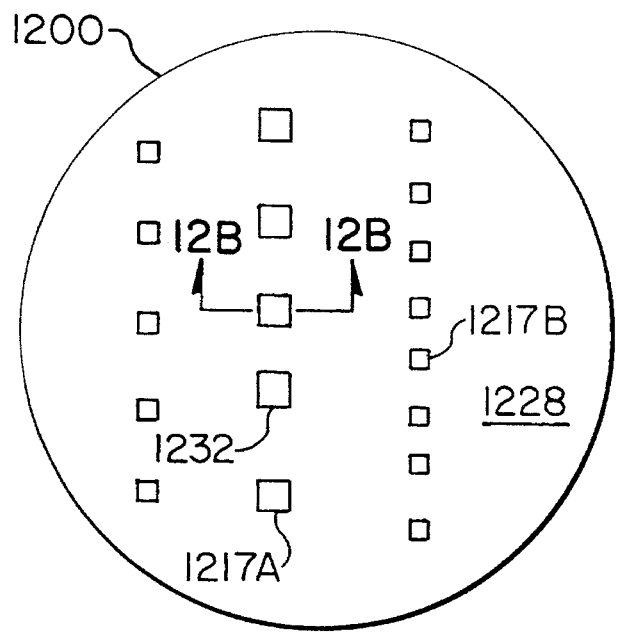
FIGS. 12a and 12b illustrate top and cross-sectional side views, respectively, of a wafer fabricated with the apparatus and methods of the invention.
Figure 12B:
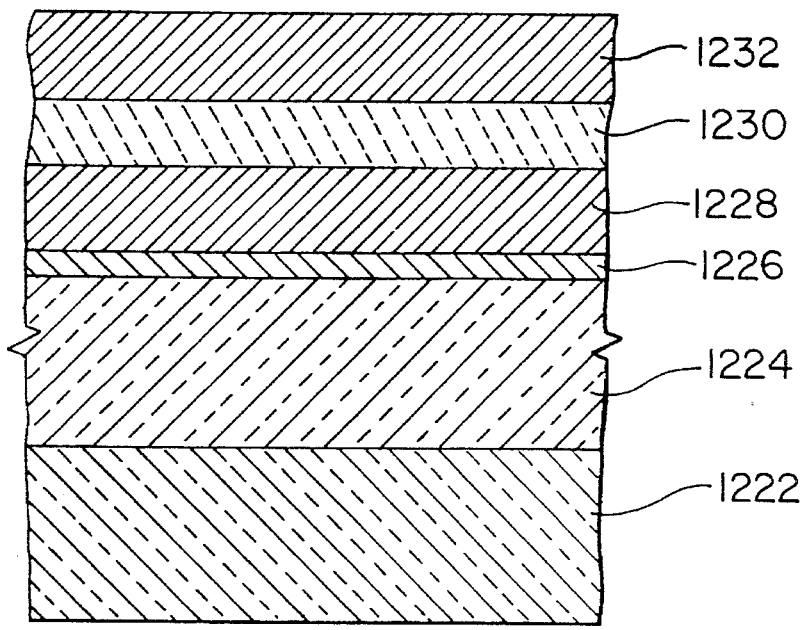

Electrical devices as may be fabricated utilizing the process of the invention are shown in FIGS. 12a through 13b. It should be understood that the FIGS. 12a and 12b depicting capacitor devices and FIG. 3b depicting an integrated circuit device are not meant to be actual plan or cross-sectional views of any particular portion of an actual capacitor or integrated circuit device, but are merely idealized representations which are employed to more clearly and fully depict the structure and process of the invention than would otherwise be possible. An exemplary wafer 1200 on which test samples of capacitor devices according to the invention have been fabricated is shown in FIG. 12a. FIG. 12b shows a cross-section of the wafer 1200 of FIG. 12a taken through the line 12B—12B. As shown in FIGS. 12a and 12b, the wafer 1200 preferably comprises a P-type silicon substrate 1222 on which an approximately 5000 Å silicon dioxide insulating layer 1224 has been wet grown. A thin layer 1226 of titanium metal has been deposited on the silicon dioxide 1224, preferably by sputtering in situ, and a 2000 Å thick electrode of platinum has been deposited on the titanium 1226, preferably by sputtering in situ. By "in situ" is meant that both the titanium and the platinum are sputtered without breaking vacuum. The titanium diffuses into the silicon dioxide and platinum and assists the platinum 1228 in adhering to the silicon dioxide 1224, and is optional. A layer 1230 of a material such as PZT of BST is then deposited utilizing the apparatus and methods of the invention discussed above another 2000 Å layer 1232 of platinum is deposited on the layer 1230. The wafer 1 is annealed, patterned with a photo-mask process, and etched down to the electrode layer 1228 to produce rectangular capacitor devices 1217A, 1217B, etc. (FIG. 2A) of various sizes separated by large areas of the electrode 1228. The size of the devices 1217A, 1217B, etc. is greatly exaggerated in FIG. 12a. Each device 1217A, 1217B, etc. may be tested by connecting one lead of the test device to the platinum electrode layer 1228 and contacting the other electrode layer 1232 of the particular device 1217A, 1217B, etc. with a fine probe connected to the other lead of the test device.

An electrical schematic of a memory cell for a conventional DRAM is shown in FIG. 13a. As is well-known, such a memory cell may be implemented in an integrated circuit wafer 1350 as shown in FIG. 13b. Portions of the circuit wafer 1350, particularly the layer 1360, may be formed utilizing the apparatus and process of the invention. When the layer 1360 is a ferroelectric material such as PZT, the cell 1370 is a non-volatile ferroelectric (FERAM) switching memory cell, and when the layer 1360 is a dielectric material such as BST, the cell 1370 is a volatile DRAM memory cell. The wafer 1350 includes a silicon substrate 1351, field oxide areas 1354, and two electrically interconnected electrical devices, a transistor 1371 and a ferroelectric switching capacitor 1372. Transistor 1371 includes a gate 1373, a source 1374, and a drain 1375. Capacitor 1372 includes first electrode 1358, ferroelectric material 1360, and second electrode 1377. Insulators, such as 1356, separate the devices 1371, 1372, except where drain 1375 of transistor 1371 is connected to first electrode 1358 of capacitor 1372. Electrical contacts, such as 1347 and 1378 make electrical connection to the devices 1371, 1372 to other parts of the integrated circuit 1350. A detailed example of the complete fabrication process for an integrated circuit memory cell as shown in FIG. 13*b* is given in U.S. patent application Ser. No. 919,186, which is incorporated herein by reference. The detailed preferred process for fabricating the layer 1360 is given above. The process of the invention discussed above may also be utilized in forming other layers of wafer 1350, preferably however, conventional processes or processes as described in U.S. patent application Ser. No. 919,186 are utilized.

The invention is advantageous in depositing complex, thin films of materials such as ferroelectrics, super-conductors, materials with high dielectric constants, gems, etc., but is not limited to depositing such complex thin films.

Although there has been described what is at present considered to be the preferred embodiments of the present invention, it will be understood that the invention can be embodied in other specific forms without departing from the spirit or essential characteristics thereof. The present embodiments are, therefore, to be considered in all aspects as illustrative and not restrictive. The scope of the invention is indicated by the appended claims rather than the foregoing description.

We claim:

1. A method of fabricating an integrated circuit comprising the steps of:

(a) providing a liquid precursor;

(b) placing a substrate inside an enclosed deposition chamber;

(c) producing a mist of said liquid precursor;

(d) flowing said mist through said deposition chamber to form a layer of the precursor liquid on said substrate while maintaining said deposition chamber and said ..substrate at substantially ambient temperature;

(e) treating the liquid layer deposited on the substrate to form a film of solid material; and (f) completing the fabrication of said integrated circuit to include at least a portion of said film of solid material in a component of said integrated circuit.

2. A method of fabricating an integrated circuit, said method comprising the steps of:

(a) providing a liquid precursor;

(b) placing a substrate inside an enclosed deposition chamber;

(C) producing a mist of said liquid precursor;

(d) flowing said mist into said deposition chamber to form a film on said substrate;

(e) maintaining a vacuum in the deposition chamber during said step of flowing;

(f) maintaining said deposition chamber and said substrate at substantially ambient temperature during said step of flowing;

(g) treating the film deposited on the substrate to form a film of solid material; and (h) completing the fabrication of said integrated to include at least a portion of said film of solid material in a component of said integrated circuit.

3. The method of claim 2, including the additional step of applying ultraviolet radiation to said mist while the mist is flowing through the deposition chamber.

4. The method of claim 1, wherein said step of flowing said mist into said deposition chamber is performed while maintaining a vacuum in the deposition chamber.

5. The method of claim 1, wherein said film is deposited while said deposition chamber is maintained at a vacuum of between approximately 200 Torr and 600 Torr.

6. The method of claim 1, wherein said mist is an aerosol.

7. The method of claim 1, wherein said step of flowing comprises injecting said mist into said deposition chamber in close proximity to and around the periphery of one side of said substrate and exhausting said mist from said deposition chamber at a region in close proximity to and around the periphery of an opposite side of said substrate to create a substantially evenly distributed flow of mist across the substrate.

8. The method of claim 1, wherein a surface of said substrate defines a substrate plane and said mist is flowed between said substrate and a barrier plate located within said deposition chamber in a spaced relation to said substrate and parallel to said substrate plane.

9. The method of claim 8, wherein said barrier plate is adjustable to vary the distance between the barrier plate and the substrate.

10. The method of claim 1, including the additional step of rotating said substrate in a plane parallel to a surface of said substrate while said mist is flowing over the substrate.

11. The method of claim 1, including the additional step of mixing a plurality of different mists external of said deposition chamber to form a mist mixture to be flowed into the deposition chamber.

12. The method of claim 1, including the additional step of applying ultraviolet radiation to said mist while the mist is flowing through the deposition chamber.

13. The method of claim 1, including the step of applying a DC bias between said deposition chamber and said substrate.

14. The method of claim 1, including the additional step of ultrasonically vibrating a quantity of said liquid precursor to form said mist by nebulization.

15. The method of claim 1, wherein said step of treating includes one or more steps from the group of drying, heating and annealing said layer deposited on said substrate.

16. The method of claim 1 wherein said step of treating comprises drying said liquid precursor deposited on said substrate.

17. The method of claim 16 wherein said step of drying comprises maintaining a sub-atmospheric pressure in said deposition chamber.

18. A method of fabricating an integrated circuit, said method comprising the steps of:

(a) providing a liquid precursor;

(b) placing a substrate inside an enclosed deposition chamber;

(C) producing a mist of said liquid precursor;

(d) flowing said mist into said deposition chamber to form a film of the precursor liquid on said substrate while maintaining said substrate at ambient temperature;

(e) treating the film deposited on the substrate to form a film of solid material; and (f) completing the fabrication of said integrated circuit to include at least a portion of said film of solid material in a component of said integrated circuit.

19. The method of claim 18, including the additional step of maintaining said deposition chamber at sub-atmospheric pressure during said flowing step.

20. The method of claim 18, wherein said deposition chamber is maintained at a pressure less than 200 Torr below atmospheric pressure.

21. The method of claim 2 wherein said step of treating comprises drying said liquid precursor deposited on said substrate.

22. The method of claim 21 wherein said step of drying comprises maintaining a sub-atmospheric pressure in said deposition chamber.

23. The method of claim 18, wherein said step of flowing comprises injecting said mist into said deposition chamber in close proximity to and around the periphery of one side of said substrate and exhausting said mist via the periphery of an opposite side of said substrate to create a substantially evenly distributed flow of mist across the substrate.

24. The method of claim 18, including the step of applying a DC bias between said deposition chamber and said substrate.

25. The method of claim 18, wherein said step of treating includes one or more steps from the group of drying, heating and annealing said substrate.

26. The method of claim 18 wherein said step of treating comprises drying said liquid precursor deposited on said substrate.

27. The method of claim 26 wherein said step of drying comprises maintaining a sub-atmospheric pressure in said deposition chamber.

28. The method of claim 2, wherein said step of treating includes one or more steps from the group of drying, heating and annealing said substrate.

29. The method of claim 2, including the step of applying a DC bias between a plate in said deposition chamber and said substrate.

* * * * *